(12) United States Patent
Gouldey et al.

(10) Patent No.: US 7,487,302 B2
(45) Date of Patent: *Feb. 3, 2009

(54) SERVICE LAYER ARCHITECTURE FOR MEMORY ACCESS SYSTEM AND METHOD

(75) Inventors: Brent I. Gouldey, Aldie, VA (US); Joel J. Fuster, Manassas, VA (US); John Rapp, Manassas, VA (US); Mark Jones, Centreville, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 334 days.

This patent is subject to a terminal disclaimer.

(21) Appl. No.: 11/243,527

(22) Filed: Oct. 3, 2005

(65) Prior Publication Data
US 2006/0123282 A1    Jun. 8, 2006

Related U.S. Application Data

(60) Provisional application No. 60/615,192, filed on Oct. 1, 2004, provisional application No. 60/615,157, filed on Oct. 1, 2004, provisional application No. 60/615, 170, filed on Oct. 1, 2004, provisional application No. 60/615,158, filed on Oct. 1, 2004, provisional application No. 60/615,193, filed on Oct. 1, 2004, provisional application No. 60/615,050, filed on Oct. 1, 2004.

(51) Int. Cl.
*G06F 12/00* (2006.01)
(52) U.S. Cl. .................. 711/154; 711/100; 711/156; 711/167; 711/168; 711/169; 712/2; 712/15; 712/20; 712/34

(58) Field of Classification Search ............... 711/100, 711/154, 156, 167–169; 712/2, 15, 20, 34
See application file for complete search history.

(56) References Cited

U.S. PATENT DOCUMENTS 4,703,475 A    10/1987    Dretzka et al.

(Continued)

FOREIGN PATENT DOCUMENTS

EP    0694847    1/1996

(Continued)

OTHER PUBLICATIONS

Bakshi S; Gajski D D; "Partitioning and Pipelining for Performance-Constrained Hardware/Software Systems", IEEE Transactions on Very Large Scale Integration (VLSI) Systems, vol. 7, NR. 4, p. 419-432, (1999-12-00), XP000869229.

(Continued)

*Primary Examiner*—Sanjiv Shah
*Assistant Examiner*—Zhuo H Li
(74) *Attorney, Agent, or Firm*—Mark A. Wurm; Graybeal Jackson LLP

(57) ABSTRACT

A memory subsystem includes a memory controller operable to generate first control signals according to a standard interface. A memory interface adapter is coupled to the memory controller and is operable responsive to the first control signals to develop second control signals adapted to be applied to a memory subsystem to access desired storage locations within the memory subsystem.

19 Claims, 10 Drawing Sheets

U.S. PATENT DOCUMENTS

| | | | |
|---|---|---|---|
| 4,862,407 A | 8/1989 | Fette et al. | |
| 4,873,626 A | 10/1989 | Gifford | |
| 4,956,771 A | 9/1990 | Neustaedter | |
| 4,985,832 A | 1/1991 | Grondalski | |
| 5,185,871 A | 2/1993 | Frey et al. | |
| 5,283,883 A | 2/1994 | Mishler | |
| 5,317,752 A | 5/1994 | Jewett et al. | |
| 5,377,333 A | 12/1994 | Nakagoshi et al. | |
| 5,583,964 A | 12/1996 | Wang | |
| 5,623,418 A | 4/1997 | Rostoker et al. | |
| 5,640,107 A | 6/1997 | Kruse | |
| 5,655,069 A | 8/1997 | Ogawara et al. | |
| 5,752,071 A | 5/1998 | Tubbs et al. | |
| 5,784,636 A | 7/1998 | Rupp | |
| 5,801,958 A | 9/1998 | Dangelo et al. | |
| 5,867,399 A | 2/1999 | Rostoker et al. | |
| 5,892,962 A | 4/1999 | Cloutier | |
| 5,909,565 A | 6/1999 | Morikawa et al. | |
| 5,910,897 A | 6/1999 | Dangelo et al. | |
| 5,916,037 A | 6/1999 | Hill | |
| 5,931,959 A | 8/1999 | Kwiat | |
| 5,933,356 A | 8/1999 | Rostoker et al. | |
| 6,018,793 A | 1/2000 | Rao | |
| 6,023,742 A | 2/2000 | Ebeling et al. | |
| 6,049,222 A | 4/2000 | Lawman | |
| 6,096,091 A | 8/2000 | Hartmann | |
| 6,108,693 A | 8/2000 | Tamura | |
| 6,112,288 A * | 8/2000 | Ullner | 712/20 |
| 6,192,384 B1 | 2/2001 | Dally et al. | |
| 6,205,516 B1 | 3/2001 | Usami | |
| 6,216,191 B1 | 4/2001 | Britton et al. | |
| 6,216,252 B1 | 4/2001 | Dangelo et al. | |
| 6,247,118 B1 | 6/2001 | Zumkehr et al. | |
| 6,253,276 B1 * | 6/2001 | Jeddeloh | 711/5 |
| 6,282,627 B1 | 8/2001 | Wong et al. | |
| 6,308,311 B1 | 10/2001 | Carmichael et al. | |
| 6,324,678 B1 | 11/2001 | Dangelo et al. | |
| 6,326,806 B1 | 12/2001 | Fallside et al. | |
| 6,470,482 B1 | 10/2002 | Rostoker et al. | |
| 6,624,819 B1 | 9/2003 | Lewis | |
| 6,625,749 B1 | 9/2003 | Quach | |
| 6,662,285 B1 | 12/2003 | Douglass et al. | |
| 6,684,314 B1 | 1/2004 | Manter | |
| 6,704,816 B1 | 3/2004 | Burke | |
| 6,769,072 B1 | 7/2004 | Kawamura et al. | |
| 6,785,842 B2 | 8/2004 | Zumkehr et al. | |
| 6,829,697 B1 | 12/2004 | Davis et al. | |
| 6,839,873 B1 | 1/2005 | Moore | |
| 6,982,976 B2 | 1/2006 | Galicki et al. | |
| 7,117,390 B1 | 10/2006 | Klarer et al. | |
| 7,134,047 B2 | 11/2006 | Quach | |
| 7,137,020 B2 | 11/2006 | Gilstrap et al. | |
| 7,228,520 B1 | 6/2007 | Keller et al. | |
| 2001/0014937 A1 | 8/2001 | Huppenthal et al. | |
| 2001/0025338 A1 | 9/2001 | Zumkehr et al. | |
| 2002/0087829 A1 | 7/2002 | Snyder et al. | |
| 2003/0009651 A1 | 1/2003 | Najam et al. | |
| 2003/0061409 A1 | 3/2003 | RuDusky | |
| 2003/0177223 A1 | 9/2003 | Erickson et al. | |
| 2004/0019771 A1 | 1/2004 | Quach | |
| 2004/0019883 A1 | 1/2004 | Banerjee et al. | |
| 2004/0045015 A1 | 3/2004 | Haji-Aghajani et al. | |
| 2004/0061147 A1 | 4/2004 | Fujita et al. | |
| 2004/0064198 A1 | 4/2004 | Reynolds et al. | |
| 2004/0130927 A1 | 7/2004 | Schulz et al. | |
| 2004/0133763 A1 * | 7/2004 | Mathur et al. | 712/34 |
| 2004/0136241 A1 | 7/2004 | Rapp et al. | |
| 2004/0153752 A1 | 8/2004 | Sutardja et al. | |
| 2004/0170070 A1 | 9/2004 | Rapp et al. | |
| 2004/0181621 A1 | 9/2004 | Manthur et al. | |
| 2005/0104743 A1 | 5/2005 | Ripolone et al. | |
| 2006/0123282 A1 * | 6/2006 | Gouldey et al. | 714/718 |
| 2006/0236018 A1 | 10/2006 | Dao et al. | |
| 2007/0055907 A1 | 3/2007 | Sutardja et al. | |

FOREIGN PATENT DOCUMENTS

| | | |
|---|---|---|
| EP | 0161438 | 12/2000 |
| EP | 1061439 | 12/2000 |
| EP | 0945788 | 8/2004 |
| JP | 2002-149424 | 5/2002 |

OTHER PUBLICATIONS

International Search Report for PCT/US2005/035818 dated Aug. 4, 2006.

International Search Report for PCT/US2005/035813.

International Search Report, PCT/US2005/035814, Feb. 23, 2006.

Lecurieux-Lafayette G: "Un Seul FPGA Dope Le Traitement D'Images", Electronique, CEP Communication, Paris, FR, No. 55, 1996, pp. 98, 101-103.

Salcic Z et al., "FLIX environment for generation of custom-configurable machines in FPLDs for embedded applications", Microprocessors and Microsystems, IPC Business Press Ltd. London, GB, vol. 23, No. 8-9, Dec. 15, 1999, pp. 513-526.

Vermeulen F. et al., "Flexible Hardware Acceleration for Multimedia Oriented Microprocessors", Micro-33. Proceedings of the 33rd Annual ACM/IEEE International Symposium on Microarchitecture, Los Alamitos, CA: IEEE Comp. Soc, US, Dec. 10, 2000, pp. 171-177.

International Search Report for PCT/US 03/34557, Dec. 21, 2004.

International Search Report for PCT/US03/34558 dated Jun. 16, 2005.

International Search Report for PCT/US03/34559 dated Jan. 7, 2005.

Free Online Dictionary of Computing (1997) Definitions of "FPGA" and "raw data"; http://foldoc.org.

Hansen (1977) The Architecture of Concurrent Programs; Prentice Hall, Inc.; pp. 16-17, 19-20, 24-27, 47-54, 72-73, 151-152.

Microsoft (1999) Microsoft Computer Dictionary, 4th Edition; Microsoft Press; p. 215.

Microsoft (2002) Microsoft Computer Dictionary, 5th Edition; Microsoft Press; pp. 77-78.

Patterson (1996) Computer Architecture, A Quantitative Approach, 2nd Edition; Morgan Kauffman; pp. 134, 155.

* cited by examiner

SERVICE LAYER ARCHITECTURE FOR MEMORY ACCESS SYSTEM AND METHOD

CLAIM OF PRIORITY

This application claims priority to U.S. Provisional Application Ser. Nos. 60/615,192, 60/615,157, 60/615,170, 60/615,158, 60/615,193, and 60/615,050, filed on 1 Oct. 2004, which are incorporated by reference.

CROSS REFERENCE TO RELATED APPLICATIONS

This application is related to U.S. patent application Ser. No. 10/684,102 entitled IMPROVED COMPUTING ARCHITECTURE AND RELATED SYSTEM AND METHOD, Ser. No. 10/684,053 entitled COMPUTING MACHINE HAVING IMPROVED COMPUTING ARCHITECTURE AND RELATED SYSTEM AND METHOD, Ser. No. 10/684,057 entitled PROGRAMMABLE CIRCUIT AND RELATED COMPUTING MACHINE AND METHOD, and Ser. No. 10/683,932 entitled PIPELINE ACCELERATOR HAVING MULTIPLE PIPELINE UNITS AND RELATED COMPUTING MACHINE AND METHOD, which have a common filing date and owner and which are incorporated by reference.

BACKGROUND

During the operation of a computer system, programs executing on the system access memory in the computer system to store data generated by the program and retrieve data being processed by the program. To access data stored in memory, a memory controller generates the appropriate signals to access the desired data stored in memory. For example, data is typically physically stored in memory in an array of rows and columns of memory storage locations, each memory location having a corresponding address. To access data stored in a particular location, the memory controller must apply a read or write command to the memory along with the address of the desired data. In response to the command and address from the controller, the memory accesses the corresponding storage location and either writes data to or reads data from that location.

Depending on the type of data being stored and processed, the accessing of the required data may be relatively complicated and thus inefficient. This is true because programs executing on the computer system must store and retrieve data for various types of more complicated data structures, such as vectors and arrays. A two dimensional array, for example, consists of a plurality of data elements arranged in rows and columns. To store the data elements of the array in memory, the memory controller simply stores these elements one after another in consecutive storage locations in the memory. While the data elements are stored in this manner, operations performed on the individual elements of the array many times necessitate that elements stored in nonconsecutive memory locations be accessed.

An example of the storage and access issues presented by a two-dimensional matrix stored in memory will now be described in more detail with reference to FIG. 1. FIG. 1 shows on the left a 10×8 matrix 100 consisting of 10 rows and 8 columns of data elements $DE_{11}$-$DE_{108}$, each data element being represented as a circle. In the following description, note that the data elements $DE_{11}$-$DE_{108}$ may be referred to generally as DE when not referring to a specific one or ones of the elements, while the subscripts will be included only when referring to a specific one or ones of the elements. The data elements DE of the matrix 100 are stored in the storage locations of a memory 102, as indicated by arrow 104. The data elements $DE_{11}$-$DE_{108}$ are stored in consecutive storage locations with a given row of storage locations in the memory 102. In the example of FIG. 1 the row in memory 102 is designated as having an address 0 and the data elements $DE_{11}$-$DE_{108}$ are stored in consecutive columns within the row, with the columns being designated 0-4F hexadecimal. Thus, the data element DE11 is stored in storage location having row address 0 and column address 0, data element DE21 is stored in row address 0 and column address 1, and so on. In FIG. 1, the storage locations in the memory 102 having row address 0 and column addresses 00-4F containing the data elements $DE_{11}$-$DE_{108}$ are shown in four separate columns merely for ease of illustration.

For the matrix 100, the first column of data elements DE11-DE101 and second column of data elements DE12-DE102 are stored in storage locations 0-13 in the memory 102, which are shown in the first column of storage locations. The data elements DE13-DE103 and DE14-DE104 in the third and fourth columns of the matrix 100 are stored in storage locations 14-27, respectively, in the memory 102. Finally, the data elements DE15-DE105 and DE16-DE106 are stored in storage locations 28-3B and data elements DE17-DE107 and DE18-DE108 are stored in storage locations 3C-4F.

When accessing the stored data elements DE, common mathematical manipulations of these elements may result in relatively complicated memory accesses or "memory behaviors". For example, the data elements DE contained in respective rows of the matrix 100 may correspond to vectors being processed by a program executing on a computer system (not shown) containing the memory 102. In this situation, the data elements DE of a desired row in the matrix 100 must be accessed to retrieve the desired vector. From the above description of the storage of the data elements DE in the memory 102, the retrieval of desired data elements in this situation is seen as requiring data elements stored in nonconsecutive storage locations to be accessed. For example, if the third row of data elements DE31-DE38 is to be retrieved, the data element DE31 stored in location 2 in the memory 102 must be accessed, then the data element DE32 stored in location C, and so on. The data elements DE31 and DE32 are illustrated in the storage locations 2 and C within the memory 102.

A stride value S, which equals 10 in the example of FIG. 1, corresponds to the difference between addresses of consecutive data elements being accessed. As seen in the example for the vector corresponding to row 3 in the matrix 100, the stride value S between consecutive data elements DE31 and DE32 equals 10, as is true for each pair of consecutive data elements in this example. Such a stride value S can be utilized to generate addresses for the desired data elements DE in this and other memory behaviors requiring nonsequential access of storage locations. For example, to generate addresses to access all data elements DE in row 3 of the matrix 100, all that is required is a base address corresponding to the address of the first data element (DE31 in this example), stride value S, and a total number N of times (7 in this example) to add the stride value to the immediately prior address. Using these parameters, each address equals a base address (BA) plus n times the stride value S where n varies from 0 to N (address=BA+n×S) for n=0-7).

Many different types of memory behaviors which involve the nonsequential access of storage locations are common and complicate the retrieval of the desired data elements DE in the memory 102. Examples of different types of memory behaviors that include the such nonsequential accessing of data elements include accessing simple and complex vectors, simple indexed arrays, sliced arrays, masked arrays, sliced and masked arrays, vectors and arrays of user defined data structures, and sliced and masked arrays of user defined structures. For example, a mask array is commonly utilized to extract the desired data elements DE while leaving the other data elements in the alone. If it was desired to extract just one data element DE contained in the same position in a number of different matrices 100 stored in the memory 102, and the element was in the same position for each matrix, then a mask array is generated that would effectively block out all of the data elements of each matrix except the data element that is desired. This mask array is then converted into read instructions that are applied to the memory 102 so that only the unmasked data element DE in each matrix is retrieved.

While a formula analogous to that developed above for the vector example can be developed for these types of memory behaviors, for a number of reasons these types of memory behaviors or can adversely affect the operation of the memory 102, as will be appreciated by those skilled in the art. Typically, such complicated memory behaviors are handled in software, which slows the access of the desired data elements DE. The programming language C++, for example, has a valarray data structure that will take a mask and then generate the proper memory addresses to apply to memory 102 to retrieve the desired data elements DE. The translation and processing of the defined mask to generate the required addresses to access the corresponding data elements DE in memory 102 is done in software. Once the mask is converted into addresses, these addresses are applied to the memory 102, typically via a memory controller (not shown), to retrieve the desired data elements.

One drawback to this approach is that the translation of the mask array into corresponding addresses is performed in software. The software translates elements in the mask array into corresponding physical addresses that are then applied to the memory 102. While performing these translations in software provides flexibility, the execution of the required programming instructions to perform the conversions is not trivial and thus may take a relatively long time. For example, even where the mask array only includes values such that only one data element DE is to be selected from the data elements of the matrix 100, the software translation algorithm still has to go through and determine the address of that single unmasked data element. The time required to perform such translations, particularly where a large number of accesses to arrays stored in memory 102 are involved, may certainly be long enough to slow down the overall operation of the computer system containing the memory.

Existing memory controllers may include circuitry that allows segmenting and striding of memory to improve performance by implementing some of the functionality for generating nonsequential addresses in the controller instead of in software. Segmentation of memory divides memory into a number of segments or partitions, such as dividing a 256 megabyte static random access memory (SRAM) into 256 one-megabyte partitions. Partitioning the memory allows instructions applied to the controller to include smaller addresses, with a controller state machine altering the addresses by adding an offset to access the proper address. The offset is determined based upon a segment address provided to the controller. Striding involves the nonsequential generation of addresses separated by a defined value defined as the stride value S, as previously discussed. While some controllers may include circuitry to stride through memory, in such controllers the stride value S is set prior to operation of the associated memory and typically cannot be changed while a program is executing on the computer system containing the memory controller and memory. Moreover, in such memory controllers the stride value S is typically limited to a constant value.

Although existing memory controllers may provide segmentation and striding functionality, this functionality is limited and not easily changed. Moreover, this functionality does not enable many more complicated memory behaviors to be implemented in hardware, meaning such behaviors must be done through software with the attendant decrease in performance. There is a need for a system and method for implementing complex memory behaviors in hardware to allow for high-speed access of memory.

SUMMARY

According to one aspect of the present invention, a memory subsystem includes a memory controller operable to generate first control signals according to a standard interface. A memory interface adapter is coupled to the memory controller and is operable responsive to the first control signals to develop second control signals adapted to be applied to a memory subsystem to access desired storage locations within the memory subsystem.

DETAILED DESCRIPTION

Figure 2:
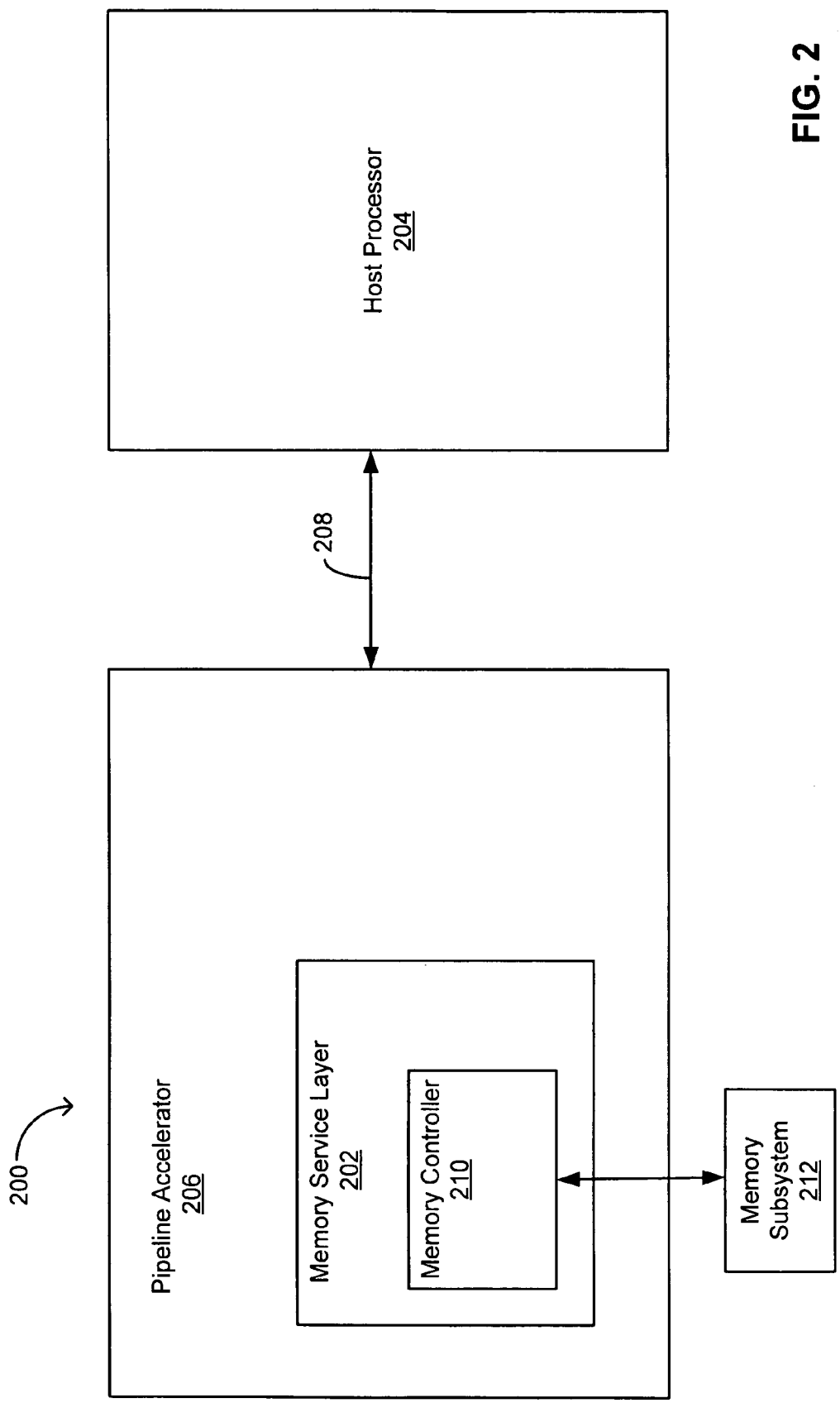
FIG. 2 is a functional block diagram of computer system having a peer vector machine (PVM) architecture including a hardware implemented memory service layer for generating desired memory addresses to implement desired memory behaviors according to one embodiment of the present invention.

FIG. 2 is a functional block diagram of computer system 200 having a peer vector machine (PVM) architecture that includes a hardware implemented memory service layer 202 for generating memory addresses to implement desired memory behaviors according to one embodiment of the present invention. The peer vector machine architecture is a new computing architecture that includes a host processor 204 that controls the overall operation and decision making operations of the system 200 and a pipeline accelerator 206 that includes programmable hardware circuitry for performing mathematically intensive operations on data, as will be described in more detail below. The pipeline accelerator 206 and host processor 204 are termed "peers" that communicate with each through data vectors transferred over a communications channel referred to as a pipeline bus 208. A memory controller 210 in the pipeline accelerator 206 contains the memory service layer 202 and communicates through this service layer to a memory subsystem 212 coupled to the controller.

In the system 200, the peer vector machine architecture divides the processing power of the system into two primary components, the pipeline accelerator 206 and host processor 204 that together form a peer vector machine. The host processor 204 performs a portion of the overall computing burden of the system 200 and primarily handles all decision making operations of the system. The pipeline accelerator 206 on the other hand does not execute any programming instructions and handles the remaining portion of the processing burden, primarily performing mathematically intensive or "number crunching" types of operations. By combining the decision-making functionality of the host processor 204 and the number-crunching functionality of the pipeline accelerator 206, the use of the peer vector machine enables the system 200 to process data faster than conventional computing architectures such as multiprocessor architectures.

With the peer vector machine architecture, the pipeline accelerator 206 may be implemented through an application specific integrated circuit (ASIC) or through programmable logic integrated circuits (PLICs) such as a field programmable gate array (FPGA). The pipeline accelerator 206 communicates with the host processor 204 over the pipeline bus 208 typically through an industry standard communications interface (not shown), such as an interface implementing the Rapid I/O or TCP/IP communications protocols. The use of such a standard communications interface simplifies the design and modification of the pipeline accelerator 206 as well as the modification of the memory service layer 202 to adaptively perform different required memory behaviors, as will be discussed in more detail below.

In operation, the host processor 204 determines which data is to be processed by the pipeline accelerator 206, and transfers such data in the form of data vectors over the pipeline bus 308 to the pipeline accelerator. The host processor 204 can also communicate configuration commands to the pipeline accelerator 206 over the pipeline bus 208 to configure the hardware circuitry pipeline accelerator to perform desired tasks. Use of an industry standard interface or bus protocol on the bus 208 enables circuitry on both sides of the bus to be more easily modified, for example. Although the host processor 204 typically transfers desired data over the pipeline bus 208 to the pipeline accelerator 206 for processing, the pipeline accelerator may also directly receive data, process the data, and then communicate this processed data back to the host processor 204 via the pipeline bus.

Regardless of how the pipeline accelerator 206 receives data, the memory controller 210 stores the received data in the memory subsystem 212 during processing of the data by the pipeline accelerator 206. As will be explained in more detail below, the memory service layer 202 in the memory controller 210 has attachable behaviors, meaning the memory service layer may be configured or programmed to perform desired memory behaviors. To configure the memory service layer 202 to execute desired memory behaviors, the host processor 204 communicates the appropriate commands over the pipeline bus 208 to the pipeline accelerator 206. It should be noted that the circuitry within the memory service layer 202 for performing various memory behaviors will be different, with some circuitry possibly requiring no configuration and the configuration of other types of circuitry differing depending on the specifics of the circuitry. For more details on such configuration and different types of such circuitry, see U.S. patent application Ser. No. 11/243,509 entitled COMPUTER-BASED TOOL AND METHOD FOR DESIGNING AN ELECTRONIC CIRCUIT AND RELATED SYSTEM, and U.S. patent application Ser. No. 11/243,506 entitled LIBRARY FOR COMPUTER-BASED TOOL AND RELATED SYSTEM AND METHOD, which were filed on Oct. 3, 2005 and which are incorporated herein by reference. In response to the commands, the pipeline accelerator 206 applies suitable control signals to the memory controller 210 which, in turn, configures the memory service layer 202 to execute the corresponding memory behaviors. Once configured, the memory service layer 202 operates in combination with the other circuitry in the memory controller 210 to access data elements stored in the memory subsystem 212 according to the desired memory behavior such as accessing elements in sliced arrays, masked arrays, or sliced and masked arrays, for example.

Figure 3:
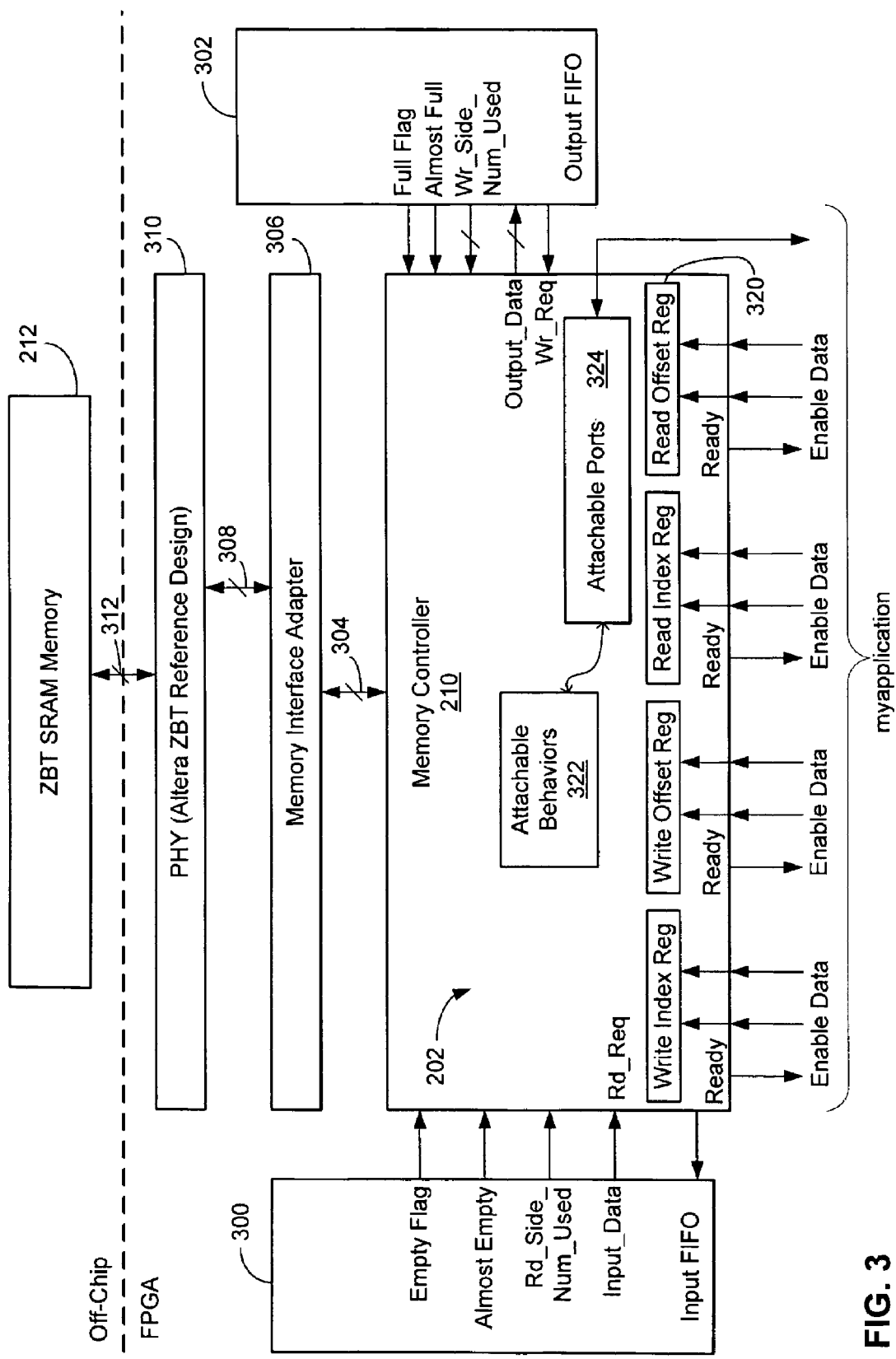
FIG. 3 is a functional block diagram illustrating in more detail the memory controller, memory service layer, and memory subsystem of FIG. 2 according to one embodiment of the present invention.

FIG. 3 is a functional block diagram illustrating in more detail the memory controller 210, memory service layer 202, and memory subsystem 212 of FIG. 2 according to one embodiment of the present invention. An input first-in-first-out (FIFO) buffer 300 receives data to be written into the memory subsystem 212, which in the example of FIG. 3 is a ZBT SRAM memory, from the pipeline accelerator 206. Similarly, a FIFO buffer 302 receives data being read from the memory subsystem 212 from the memory controller 210. Although the FIFO buffers 300 and 302 are shown separate from the memory controller 210, these buffers may be considered part of the memory controller in the embodiment of FIG. 2. To read data from or write data into the memory subsystem 212, the memory controller 210 applies appropriate control signals 304 to a memory interface adapter 306. In response to the control signals 304 from the memory controller 210, the memory interface adapter 306 applies suitable control signals 308 to a physical control layer 310. The physical control layer 310 develops control signals 312 in response to the control signals 308 from the memory interface adapter 306, with the control signals 312 being applied to the memory subsystem 212 to read data from or write data into the desired storage locations within the memory subsystem. The memory interface adapter 306 decouples the memory controller 210 and the memory subsystem 212, which allows the same controller to be utilized with different types of memory subsystems. Only the adapter 306 need be modified to interface the controller 212 to different types of memory subsystems 212, saving design time and effort by utilizing a known operational controller. It should be noted that as used herein, the term control signals includes all required signals to perform the described function, and thus, for example, the control signals 304, 308, and 312 include all required control, address, and data signals to perform the desired access of the memory subsystem 212.

In the embodiment of FIG. 3, the memory service layer 202 within the memory controller 210 includes a write index register 314 that stores a write index value which the memory service layer utilizes to select specific parameters to be utilized for a particular memory behavior during write operations (i.e., during the writing of data into the memory subsystem 212). A write offset register 316 stores a write offset value that is added to a write base address received by the memory controller 210, with the base address being typically supplied from either the host processor 204 via the bus 208 and pipeline accelerator 206 or from one of a plurality of pipeline units (not shown) contained in the pipeline accelerator, as will be explained in more detail below. A read index register 318 stores a read index value which the memory service layer 202 utilizes to select specific parameters to be utilized for a particular memory behavior during read operations (i.e., during the reading of data from the memory subsystem 212). A read offset register 320 stores a read offset value that is added to a read base address received by the memory controller 210. In the example of FIG. 3, these index and offset values are shown as being provided by a program "myApplication" which corresponds to a hardware pipeline (not shown) in the pipeline accelerator 206.

The memory service layer 202 further includes attachable behaviors circuitry 322 that utilizes the values stored in the registers 314-320 along with parameters loaded into the circuitry from the host processor 202 through attachable ports 324 to generate memory addresses to implement desired memory behaviors. The specific circuitry contained within the attachable behaviors circuitry 322 depends upon the desired address patterns that the circuitry is designed to perform, with each address pattern corresponding to a respective memory behavior. Two sample embodiments of the attachable behaviors circuitry 322 will now be described in more detail with reference to FIGS. 4 and 5.

Figure 4:
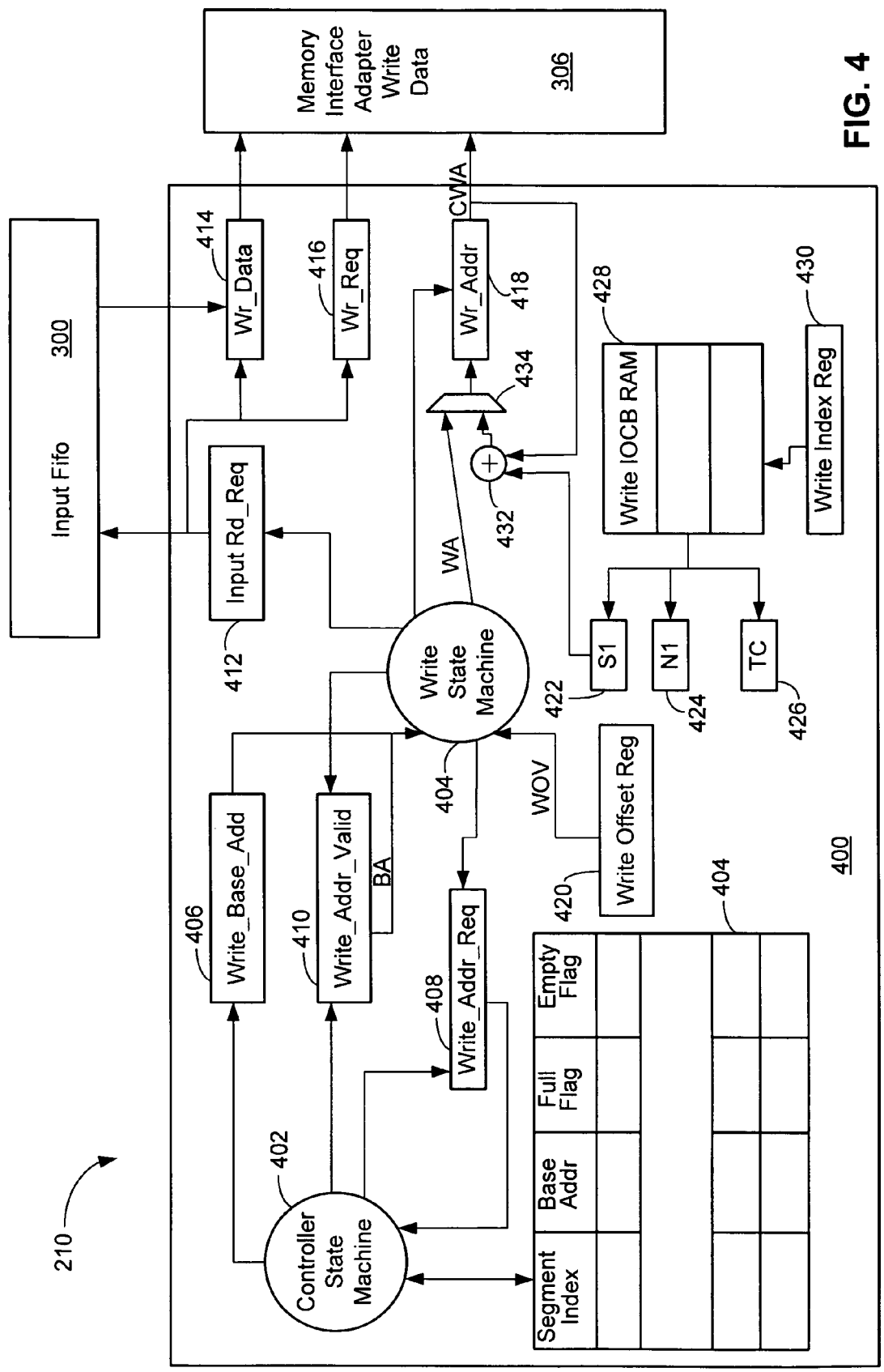
FIG. 4 is a functional block diagram illustrating in more detail an example of the attachable behaviors circuitry or hardware implemented address-generation circuitry contained in the memory controller of FIG. 3 according to one embodiment of the present invention.

FIG. 4 is a more detailed functional block diagram of one embodiment of the memory controller 210 of FIG. 3. The controller 210 includes attachable behaviors circuitry 400, which as previously described is the hardware implemented address-generation circuitry that enables the controller to perform desired memory behaviors. The attachable behaviors circuitry 400 thus corresponds to one embodiment of the attachable behaviors circuitry 322 previously discussed with reference to FIG. 3. Note that the embodiment of FIG. 4 shows only components associated with writing data to the memory subsystem 212 (FIG. 3), with the components for reading data from the memory subsystem being analogous and understood by those skilled in the art. All components in the memory controller 210 other than the attachable behaviors circuitry 400 are conventional and will therefore be described only briefly to provide a sufficient basis for understanding the operation of the attachable behaviors circuitry.

The controller 210 includes a controller state machine 402 which controls the overall operation of the controller and handles such functions as ensuring proper time division multiplexing of data on a data bus of the controller between read and write operations. The memory controller 210 further includes a segment table 404 that provides for partitioning of the storage capacity of the memory subsystem 212 into a number of different logical blocks are memory partitions. The segment table 404 includes a plurality of segment index values, base address values, and full and empty flag values. Each memory partition is assigned an associated segment index value, and thus when a write command is applied to the memory controller that write command includes a segment index value corresponding to the memory partition to which data is to be written. Similarly, each memory partition is assigned a base address corresponding to the address of the first storage location in the partition.

Each memory partition has a known size, and thus by knowing the base address each storage location within a given memory partition can be accessed. The full flag indicates whether a given memory partition is full of data while the empty flag indicates no data is stored in the associated memory partition. In the segment table 404, each row defines these values for a corresponding memory partition. For example, assume the first row in the segment table 404 contains the segment index value corresponding to a first memory partition. The base address and full and empty flags in this first row corresponding to the base address value for the first memory partition and the flags indicate the status of data stored within that partition. Thus, for each memory partition the segment table 404 includes a corresponding row of values.

The controller state machine 402 provides the base address, which is designated BA, for the memory partition to which data is to be written to a write state machine 404 as represented by a write base address box 406. The write state machine 404 triggers the controller state machine 402 to start generating memory addresses once the base address BA is applied, as represented by the box 408. The controller state machine 402 also determines whether the base address BA is valid for the given memory partition to which data is being written, as represented by the box 410.

During a write operation, the write state machine 404 provides an input read request to the input FIFO 300 (FIG. 3) as represented by box 412. In response to this input read request, the input FIFO 300 provides write data to be written to the memory subsystem 212 to the controller 210, as represented by box 414. Along with the write data 414, the controller 210 generates a write command or request 416. The write data 414 and request 416 defined two of the three components that must be supplied to the memory subsystem 212 to access the correct storage locations, with the third component being the current write address CWA as represented by box 418.

The write state machine 404 generates a write address WA that is derived from the applied base address BA plus a write offset value WOV stored in a write offset register 420. The write address WA generated by the write state machine 404 equals the base address BA plus the write offset value WOV stored in the register 420. The write offset register 420 is one of the components in the attachable behaviors circuitry 400 that enables the circuitry to generate the desired pattern of memory addresses to achieve the desired memory behavior.

Figure 1:
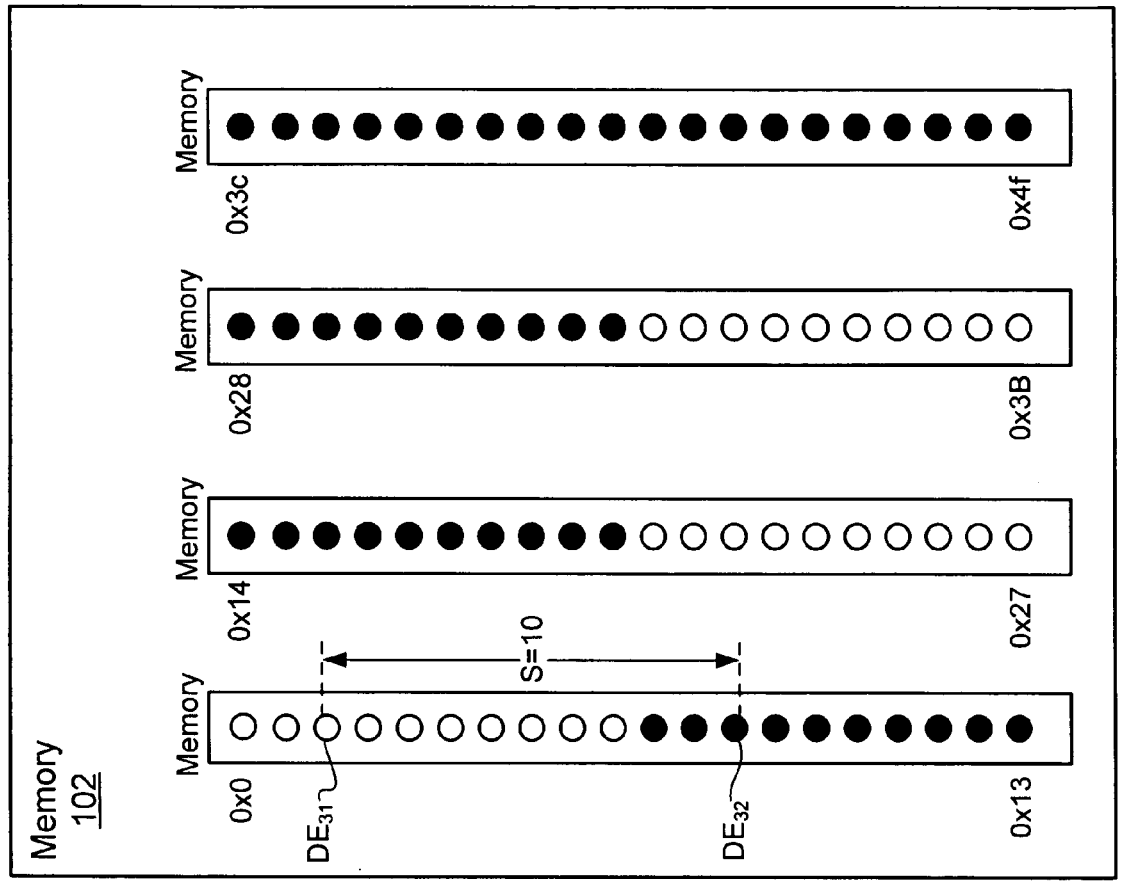
FIG. 1 is a diagram illustrating the storage of data elements of a matrix in a conventional memory system.
Figure 1:
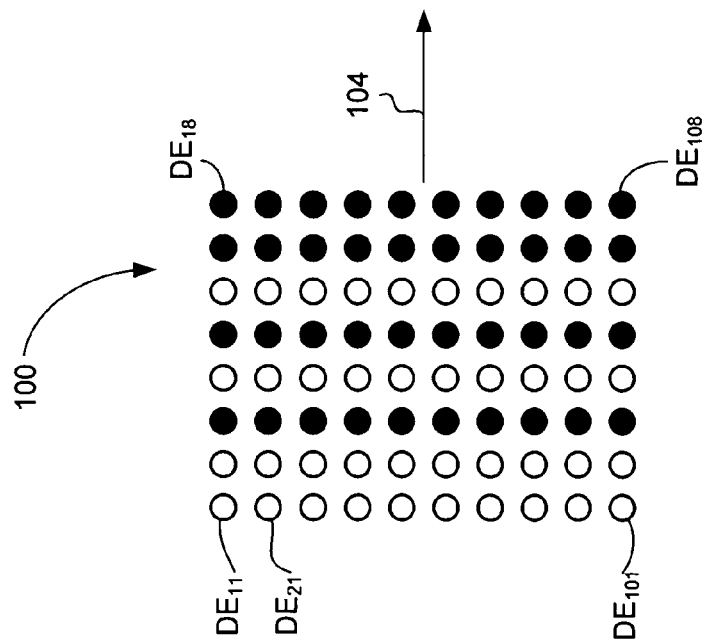

The attachable behaviors circuitry 400 further includes a stride value register 422 for storing a stride value S1, where the stride value is a number to be added to a previous memory address to obtain the current memory address, as previously described with reference to FIG. 1. A register 424 stores a number of times value N1 indicating the number of times the stride value S1 is to be added to the current address. A register 426 stores a total count value TC indicating the total number of times to perform the stride value S1 for the given number of times parameter N1. The attachable behaviors circuitry 400 further includes a write IOCB RAM 428 that stores an array of values for the stride S1, number of times N1, and total count TC values. Each row of the array stored in the write IOCB RAM 428 stores a respective stride S1, number of times N1, and total count TC value, with the values for these parameters from one of the rows being stored in the registers 422-426 during operation of the memory controller 210. A write index register 430 stores an index value which determines which row of stride S1, number of times N1, and total count TC values are stored in the registers 422-426. In this way, during operation of the memory controller 210 the host processor 204 (FIG. 2) can change the index value stored in the register 430 to thereby change the values S1, N1, TC stored in the registers 422-426. Note that the write offset value WOV stored in the register 420 could also be stored in the write IOCB RAM 428 and loaded into this register as are the S1, N1, and TC values. Also note that the values S1, N1, TC could be loaded directly into the registers 422-426 in other embodiments of the present invention, and thus the write IOCB RAM 428 is not required in all embodiments.

A summing circuit 432 sums the stride value S1 with the current write address CWA and this sum is applied to a multiplexer 434. During the first access of the memory subsystem 212, the multiplexer 434 outputs the write address WA from the write state machine 404 as the current write address CWA. Thereafter, the multiplexer 434 outputs this sum of the current write address CWA plus the stride value S1 from the summation circuit 432 as the new current write address. The memory controller 210 applies current write address CWA along with the write request 416 and write data 414 to the memory interface adapter 306 which, as previously described, generates control signals 308 that are applied through a physical control layer 310 (FIG. 3) to access the proper storage locations in the memory subsystem 212 (FIG. 3).

The embodiment of the attachable behaviors circuit 400 shown in FIG. 4 is merely an example that provides the memory controller 210 with a striding memory behavior. In other embodiments, the attachable behaviors circuit 400 will include different or additional components to provide the memory controller 210 with all desired memory behaviors. The number and type of registers along with the particular parameters stored in the write IOCB RAM 428 will of course very depending upon the type of memory behavior.

Figure 5:
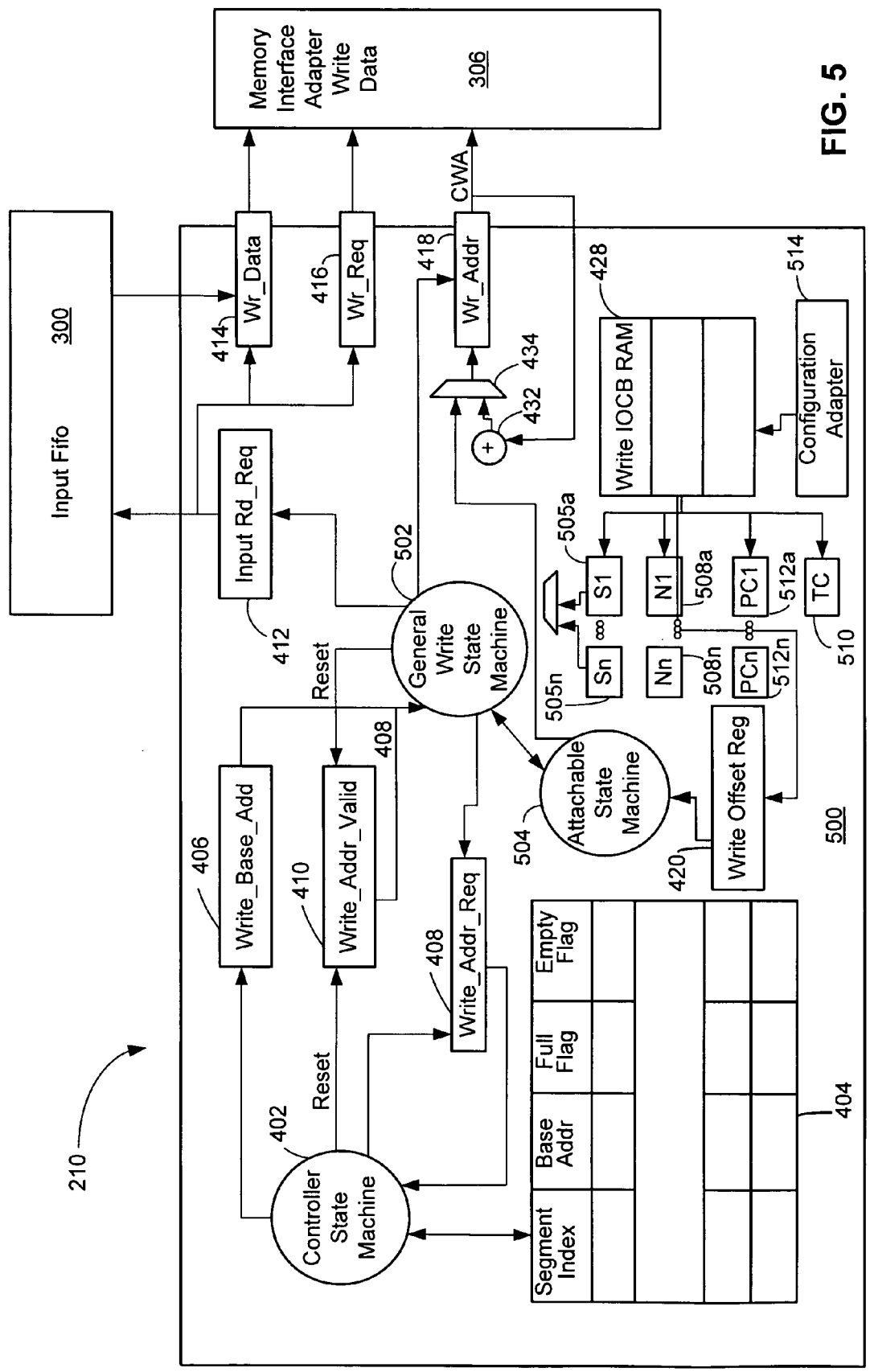
FIG. 5 is a functional block diagram illustrating in more detail another example of the attachable behaviors or hardware implemented address-generation circuitry contained in the memory controller of FIG. 3 according to another embodiment of the present invention.

FIG. 5 is a more detailed functional block diagram of another embodiment of the memory controller 210 of FIG. 3. In the embodiment of FIG. 5, the controller 210 includes attachable behaviors circuitry 500, which once again is hardware implemented address-generation circuitry that enables the controller to perform desired memory behaviors. All components in the embodiment of FIG. 5 that are the same as those previously described with reference to FIG. 4 have been given the same reference numbers, and for the sake of brevity will not again be described in detail. The attachable behaviors circuitry 500 works in combination with an existing general write state machine 502 contained in the memory controller 210, in contrast to the embodiment of FIG. 4 in which the write state machine 404 is modified to perform regular memory accesses along with the desired memory behaviors. Thus, the attachable behaviors circuitry 500 includes an attachable state machine 504 that works in combination with the general write state machine 502 to provide the desired memory accesses. The embodiment of FIG. 5 would typically be an easier design to implement since the presumably known operable general write state machine 502 would already exist and no modifications to this known functional component are made. In contrast, in the embodiment of FIG. 4 the write state machine 404 is a modified version of a general write state machine.

One example memory pattern is for the case of a Triangular matrix where the matrix is stored with no wasted memory space. The example embodiment of the attachable behaviors circuitry 500 in FIG. 5 includes a number of stride value registers 506a-n, a plurality of number of times registers 508a-n, a total count register 510, and a plurality of partial count registers 512a-n. The write IOCB RAM 428 stores values S1-Sn, N1-Nn, PC1-PCn, and TC that are loaded through a configuration adapter 514. The configuration adapter 514 loads these values into the write IOCB RAM 428 from values supplied either from software running on the host processor 204 (FIG. 2) or from a pipeline unit contained in the pipeline accelerator 206 (FIG. 2). The values S1-Sn, N1-Nn, PC1-PCn, and TC and components in the attachable behaviors circuitry 500 operate in combination to provide a set of a regular memory accesses, such as may occur where the data structure being accessed in the memory subsystem 212 is a sparse array.

Contrasting FIG. 4 and FIG. 5 illustrates the need for being able to insert new or different circuits exhibiting different behaviors into the persistent function of the memory controller through a standard, well established, well defined interface. New implementations of memory behavior can be achieved by the designer as long as it complies with the standard attachable behavior interface.

Figure 6:
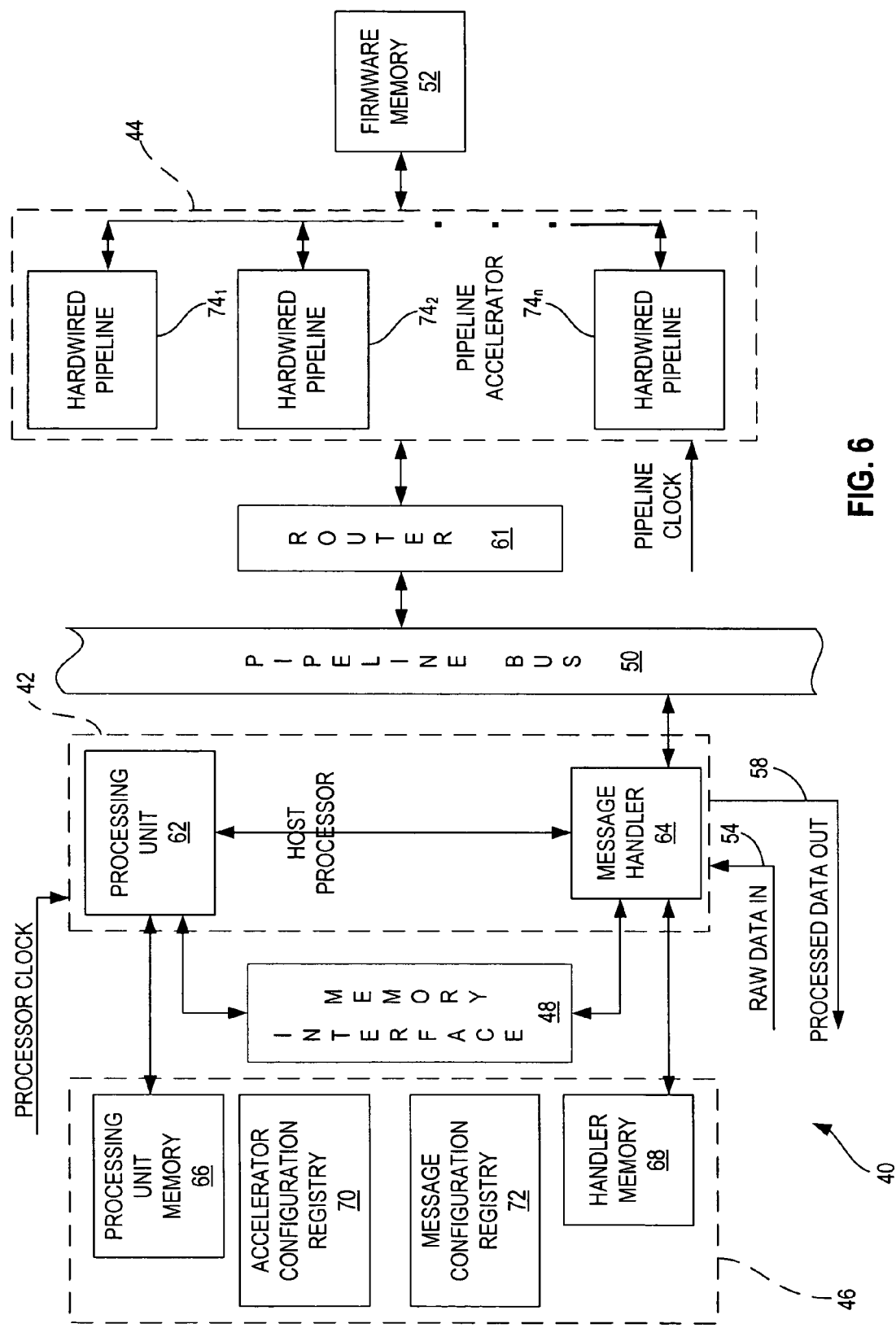
FIG. 6 is a more detailed functional block diagram of one embodiment of the host processor and pipeline accelerator of the peer vector machine (PVM) of FIG. 2.

The FIG. 6 is a more detailed functional block diagram of a peer vector machine 40 that may be included in the system 200 of FIG. 2 according to one embodiment of the present invention. The peer vector machine 40 includes a host processor 42 corresponding to the host processor 204 of FIG. 2 and a pipeline accelerator 44 corresponding to the pipeline accelerator 206 of FIG. 2. The host processor 42 communicates with the pipeline accelerator 44 through a pipeline bus 50 that corresponds to the communications channel 208 of FIG. 2. Data is communicated over the pipeline bus 50 according to an industry standard interface in one embodiment of present invention, which facilitates the design and modification of the machine 40.

The peer vector machine 40 generally and the host processor 42 and pipeline accelerator 44 more specifically are described in more detail in U.S. patent application Ser. No. 10/684,102 entitled IMPROVED COMPUTING ARCHITECTURE AND RELATED SYSTEM AND METHOD, application Ser. No. 10/684,053 entitled COMPUTING MACHINE HAVING IMPROVED COMPUTING ARCHITECTURE AND RELATED SYSTEM AND METHOD, application Ser. No. 10/683,929 entitled PIPELINE ACCELERATOR FOR IMPROVED COMPUTING ARCHITECTURE AND RELATED SYSTEM AND METHOD, application Ser. No. 10/684,057 entitled PROGRAMMABLE CIRCUIT AND RELATED COMPUTING MACHINE AND METHOD, and Ser. No. 10/683,932 entitled PIPELINE ACCELERATOR HAVING MULTIPLE PIPELINE UNITS AND RELATED COMPUTING MACHINE AND METHOD, all of which have a common filing date of Oct. 9, 2003 and a common owner and which are incorporated herein by reference.

In addition to the host processor 42 and the pipeline accelerator 44, the peer vector computing machine 40 includes a processor memory 46, an interface memory 48, a bus 50, a firmware memory 52, an optional raw-data input port 54, a processed-data output port 58, and an optional router 61.

The host processor 42 includes a processing unit 62 and a message handler 64, and the processor memory 46 includes a processing-unit memory 66 and a handler memory 68, which respectively serve as both program and working memories for the processor unit and the message handler. The processor memory 46 also includes an accelerator-configuration registry 70 and a message-configuration registry 72, which store respective configuration data that allow the host processor 42 to configure the functioning of the accelerator 44 and the format of the messages that the message handler 64 sends and receives.

The pipeline accelerator 44 is disposed on at least one programmable logic integrated circuit (PLIC) (not shown) and includes hardwired pipelines $74_1$-$74_n$, which process respective data without executing program instructions. The firmware memory 52 stores the configuration firmware for the accelerator 44. If the accelerator 44 is disposed on multiple PLICs, these PLICs and their respective firmware memories may be disposed in multiple pipeline units (FIG. 6). The accelerator 44 and pipeline units are discussed further below and in previously cited U.S. patent application Ser. No. 10/683,932 entitled PIPELINE ACCELERATOR HAVING MULTIPLE PIPELINE UNITS AND RELATED COMPUTING MACHINE AND METHOD. Alternatively, the accelerator 44 may be disposed on at least one application specific integrated circuit (ASIC), and thus may have internal interconnections that are not configurable. In this alternative, the machine 40 may omit the firmware memory 52. Furthermore, although the accelerator 44 is shown including multiple pipelines 74, it may include only a single pipeline. In addition, although not shown, the accelerator 44 may include one or more processors such as a digital-signal processor (DSP).

Figure 7:
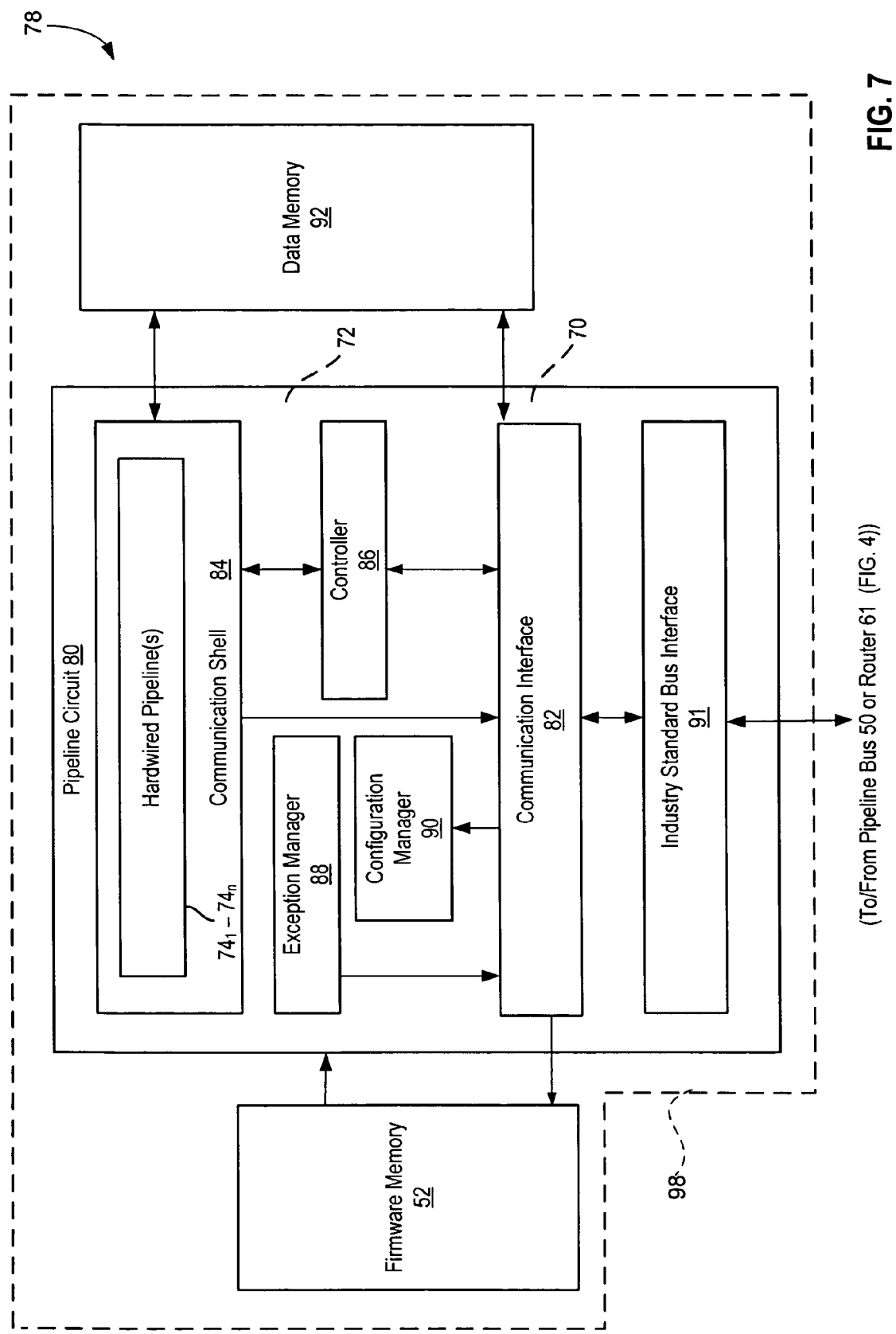
FIG. 7 is a more detailed block diagram of the pipeline accelerator of FIG. 6 according to one embodiment of the present invention.

FIG. 7 is a more detailed block diagram of the pipeline accelerator 44 of FIG. 4 according to one embodiment of the present invention. The accelerator 44 includes one or more pipeline units 78, one of which is shown in FIG. 7. Each pipeline unit 78 includes a pipeline circuit 80, such as a PLIC or an ASIC. As discussed further below and in previously cited U.S. patent application Ser. No. 10/683,932 entitled PIPELINE ACCELERATOR HAVING MULTIPLE PIPELINE UNITS AND RELATED COMPUTING MACHINE AND METHOD, each pipeline unit 78 is a "peer" of the host processor 42 and of the other pipeline units of the accelerator 44. That is, each pipeline unit 78 can communicate directly with the host processor 42 or with any other pipeline unit. Thus, this peer-vector architecture prevents data "bottlenecks" that otherwise might occur if all of the pipeline units 78 communicated through a central location such as a master pipeline unit (not shown) or the host processor 42. Furthermore, it allows one to add or remove peers from the peer-vector machine 40 (FIG. 6) without significant modifications to the machine.

The pipeline circuit 80 includes a communication interface 82, which transfers data between a peer, such as the host processor 42 (FIG. 6), and the following other components of the pipeline circuit: the hardwired pipelines $74_1$-$74_n$ (FIG. 6) via a communication shell 84, a controller 86, an exception manager 88, and a configuration manager 90. The pipeline circuit 80 may also include an industry-standard bus interface 91. Alternatively, the functionality of the interface 91 may be included within the communication interface 82. Where a bandwidth-enhancement technique such as xDSL is utilized to increase the effective bandwidth of the pipeline bus 50, the communication interface 82 and bus interface 91 are modified as necessary to implement the bandwidth-enhancement technique, as will be appreciated by those skilled in the art.

The communication interface 82 sends and receives data in a format recognized by the message handler 64 (FIG. 6), and thus typically facilitates the design and modification of the peer-vector machine 40 (FIG. 6). For example, if the data format is an industry standard such as the Rapid I/O format, then one need not design a custom interface between the host processor 42 and the accelerator 44. Furthermore, by allowing the pipeline circuit 80 to communicate with other peers, such as the host processor 42 (FIG. 6), via the pipeline bus 50 instead of via a non-bus interface, one can change the number of pipeline units 78 by merely connecting or disconnecting them (or the circuit cards that hold them) to the pipeline bus instead of redesigning a non-bus interface from scratch each time a pipeline unit is added or removed.

The hardwired pipelines $74_1$-$74_n$ perform respective operations on data as discussed above in conjunction with FIG. 6 and in previously cited U.S. patent application Ser. No. 10/684,102 entitled IMPROVED COMPUTING ARCHITECTURE AND RELATED SYSTEM AND METHOD, and the communication shell 84 interfaces the pipelines to the other components of the pipeline circuit 80 and to circuits (such as a data memory 92 discussed below) external to the pipeline circuit.

The controller 86 synchronizes the hardwired pipelines $74_1$-$74_n$ and monitors and controls the sequence in which they perform the respective data operations in response to communications, i.e., "events," from other peers. For example, a peer such as the host processor 42 may send an event to the pipeline unit 78 via the pipeline bus 50 to indicate that the peer has finished sending a block of data to the pipeline unit and to cause the hardwired pipelines $74_1$-$74_n$ to begin processing this data. An event that includes data is typically called a message, and an event that does not include data is typically called a "door bell." Furthermore, as discussed below in conjunction with FIG. 8, the pipeline unit 78 may also synchronize the pipelines $74_1$-$74_n$ in response to a synchronization signal.

The exception manager 88 monitors the status of the hardwired pipelines $74_1$-$74_n$, the communication interface 82, the communication shell 84, the controller 86, and the bus interface 91, and reports exceptions to the host processor 42 (FIG. 6). For example, if a buffer in the communication interface 82 overflows, then the exception manager 88 reports this to the host processor 42. The exception manager may also correct, or attempt to correct, the problem giving rise to the exception. For example, for an overflowing buffer, the exception manager 88 may increase the size of the buffer, either directly or via the configuration manager 90 as discussed below.

The configuration manager 90 sets the soft configuration of the hardwired pipelines $74_1$-$74_n$, the communication interface 82, the communication shell 84, the controller 86, the exception manager 88, and the interface 91 in response to soft-configuration data from the host processor 42 (FIG. 6)—as discussed in previously cited U.S. patent application Ser. No. 10/684,102 entitled IMPROVED COMPUTING ARCHITECTURE AND RELATED SYSTEM AND METHOD, the hard configuration denotes the actual topology, on the transistor and circuit-block level, of the pipeline circuit 80, and the soft configuration denotes the physical parameters (e.g., data width, table size) of the hard-configured components. That is, soft configuration data is similar to the data that can be loaded into a register of a processor (not shown in FIG. 4) to set the operating mode (e.g., burst-memory mode) of the processor. For example, the host processor 42 may send soft-configuration data that causes the configuration manager 90 to set the number and respective priority levels of queues in the communication interface 82. The exception manager 88 may also send soft-configuration data that causes the configuration manager 90 to, e.g., increase the size of an overflowing buffer in the communication interface 82.

Still referring to FIG. 7, in addition to the pipeline circuit 80, the pipeline unit 78 of the accelerator 44 includes the data memory 92, an optional communication bus 94, and, if the pipeline circuit is a PLIC, the firmware memory 52 (FIG. 4). The data memory 92 buffers data as it flows between another peer, such as the host processor 42 (FIG. 6), and the hardwired pipelines $74_1$-$74_n$, and is also a working memory for the hardwired pipelines. The data memory 92 corresponds to the memory subsystem 212 of FIG. 2. The communication interface 82 interfaces the data memory 92 to the pipeline bus 50 (via the communication bus 94 and industry-standard interface 91 if present), and the communication shell 84 interfaces the data memory to the hardwired pipelines $74_1$-$74_n$.

The industry-standard interface 91 is a conventional bus-interface circuit that reduces the size and complexity of the communication interface 82 by effectively offloading some of the interface circuitry from the communication interface. Therefore, if one wishes to change the parameters of the pipeline bus 50 or router 61 (FIG. 6), then he need only modify the interface 91 and not the communication interface 82. Alternatively, one may dispose the interface 91 in an IC (not shown) that is external to the pipeline circuit 80. Offloading the interface 91 from the pipeline circuit 80 frees up resources on the pipeline circuit for use in, e.g., the hardwired pipelines $74_1$-$74_n$ and the controller 86. Or, as discussed above, the bus interface 91 may be part of the communication interface 82.

As discussed above in conjunction with FIG. 6, where the pipeline circuit 80 is a PLIC, the firmware memory 52 stores the firmware that sets the hard configuration of the pipeline circuit. The memory 52 loads the firmware into the pipeline circuit 80 during the configuration of the accelerator 44, and may receive modified firmware from the host processor 42 (FIG. 6) via the communication interface 82 during or after the configuration of the accelerator. The loading and receiving of firmware is further discussed in previously cited U.S. patent application Ser. No. 10/684,057 entitled PROGRAMMABLE CIRCUIT AND RELATED COMPUTING MACHINE AND METHOD.

Still referring to FIG. 7, the pipeline circuit 80, data memory 92, and firmware memory 52 may be disposed on a circuit board or card 98, which may be plugged into a pipeline-bus connector (not shown) much like a daughter card can be plugged into a slot of a mother board in a personal computer (not shown). Although not shown, conventional ICs and components such as a power regulator and a power sequencer may also be disposed on the card 98 as is known. The sensors 36 could also include suitable cards that plug into slots and include wiring or other required components for coupling such a card to the actual transducer portion of the each sensor. One such card could be associated with each sensor 36 or each sensor could include a respective card.

Figure 8:
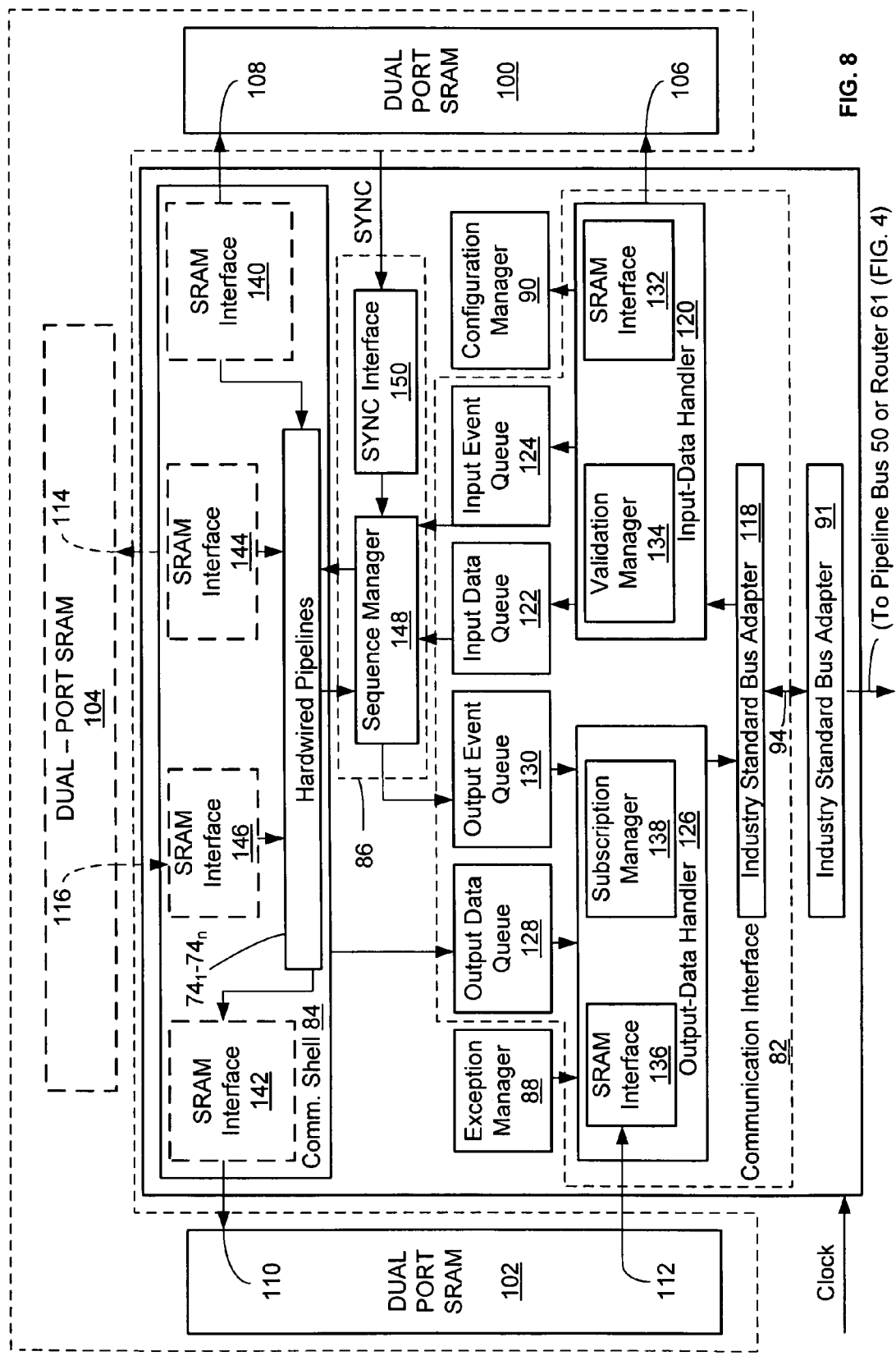
FIG. 8 is an even more detailed block diagram of the hardwired pipeline circuit and the data memory of FIG. 7 according to one embodiment of the present invention.

Further details of the structure and operation of the pipeline unit 78 will now be discussed in conjunction with FIG. 8. FIG. 8 is a block diagram of the pipeline unit 78 of FIG. 6 according to an embodiment of the invention. For clarity, the firmware memory 52 is omitted from FIG. 8. The pipeline circuit 80 receives a master CLOCK signal, which drives the below-described components of the pipeline circuit either directly or indirectly. The pipeline circuit 80 may generate one or more slave clock signals (not shown) from the master CLOCK signal in a conventional manner. The pipeline circuit 80 may also receive a synchronization signal SYNC as discussed below. The data memory 92 includes an input dual-port-static-random-access memory (DPSRAM) 100, an output DPSRAM 102, and an optional working DPSRAM 104.

The input DPSRAM 100 includes an input port 106 for receiving data from a peer, such as the host processor 42 (FIG. 6), via the communication interface 82, and includes an output port 108 for providing this data to the hardwired pipelines $74_1$-$74_n$ via the communication shell 84. Having two ports, one for data input and one for data output, increases the speed and efficiency of data transfer to/from the DPSRAM 100 because the communication interface 82 can write data to the DPSRAM while the pipelines $74_1$-$74_n$ read data from the DPSRAM. Furthermore, as discussed above, using the DPSRAM 100 to buffer data from a peer such as the host processor 42 allows the peer and the pipelines $74_1$-$74_n$ to operate asynchronously relative to one and other. That is, the peer can send data to the pipelines $74_1$-$74_n$ without "waiting" for the pipelines to complete a current operation. Likewise, the pipelines $74_1$-$74_n$ can retrieve data without "waiting" for the peer to complete a data-sending operation.

Similarly, the output DPSRAM 102 includes an input port 110 for receiving data from the hardwired pipelines $74_1$-$74_n$ via the communication shell 84, and includes an output port 112 for providing this data to a peer, such as the host processor 42 (FIG. 6), via the communication interface 82. As discussed above, the two data ports 110 (input) and 112 (output) increase the speed and efficiency of data transfer to/from the DPSRAM 102, and using the DPSRAM 102 to buffer data from the pipelines $74_1$-$74_n$ allows the peer and the pipelines to operate asynchronously relative to one another. That is, the pipelines $74_1$-$74_n$ can publish data to the peer without "waiting" for the output-data handler 126 to complete a data transfer to the peer or to another peer. Likewise, the output-data handler 126 can transfer data to a peer without "waiting" for the pipelines $74_1$-$74_n$ to complete a data-publishing operation.

The working DPSRAM 104 includes an input port 114 for receiving data from the hardwired pipelines $74_1$-$74_n$ via the communication shell 84, and includes an output port 116 for returning this data back to the pipelines via the communication shell. While processing input data received from the DPSRAM 100, the pipelines $74_1$-$74_n$ may need to temporarily store partially processed, i.e., intermediate, data before continuing the processing of this data. For example, a first pipeline, such as the pipeline $74_1$, may generate intermediate data for further processing by a second pipeline, such as the pipeline $74_2$; thus, the first pipeline may need to temporarily store the intermediate data until the second pipeline retrieves it. The working DPSRAM 104 provides this temporary storage. As discussed above, the two data ports 114 (input) and 116 (output) increase the speed and efficiency of data transfer between the pipelines $74_1$-$74_n$ and the DPSRAM 104. Furthermore, including a separate working DPSRAM 104 typically increases the speed and efficiency of the pipeline circuit 80 by allowing the DPSRAMs 100 and 102 to function exclusively as data-input and data-output buffers, respectively. But, with slight modification to the pipeline circuit 80, either or both of the DPSRAMS 100 and 102 can also be a working memory for the pipelines $74_1$-$74_n$ when the DPSRAM 104 is omitted, and even when it is present.

Although the DPSRAMS 100, 102, and 104 are described as being external to the pipeline circuit 80, one or more of these DPSRAMS, or equivalents thereto, may be internal to the pipeline circuit.

Still referring to FIG. 8, the communication interface 82 includes an industry-standard bus adapter 118, an input-data handler 120, input-data and input-event queues 122 and 124, an output-data handler 126, and output-data and output-event queues 128 and 130. Although the queues 122, 124, 128, and 130 are shown as single queues, one or more of these queues may include sub queues (not shown) that allow segregation by, e.g., priority, of the values stored in the queues or of the respective data that these values represent.

The industry-standard bus adapter 118 includes the physical layer that allows the transfer of data between the pipeline circuit 80 and the pipeline bus 50 (FIG. 6) via the communication bus 94 (FIG. 7). Therefore, if one wishes to change the parameters of the bus 94, then he need only modify the adapter 118 and not the entire communication interface 82. Where the industry-standard bus interface 91 is omitted from the pipeline unit 78, then the adapter 118 may be modified to allow the transfer of data directly between the pipeline bus 50 and the pipeline circuit 80. In this latter implementation, the modified adapter 118 includes the functionality of the bus interface 91, and one need only modify the adapter 118 if he/she wishes to change the parameters of the bus 50. For example, where a bandwidth-enhancement technique such as ADSL is utilized to communicate data over the bus 50 the adapter 118 is modified accordingly to implement the bandwidth-enhancement technique.

The input-data handler 120 receives data from the industry-standard adapter 118, loads the data into the DPSRAM 100 via the input port 106, and generates and stores a pointer to the data and a corresponding data identifier in the input-data queue 122. If the data is the payload of a message from a peer, such as the host processor 42 (FIG. 3), then the input-data handler 120 extracts the data from the message before loading the data into the DPSRAM 100. The input-data handler 120 includes an interface 132, which writes the data to the input port 106 of the DPSRAM 100 and which is further discussed below in conjunction with FIG. 6. Alternatively, the input-data handler 120 can omit the extraction step and load the entire message into the DPSRAM 100. The input-data handler 120 also receives events from the industry-standard bus adapter 118, and loads the events into the input-event queue 124.

Furthermore, the input-data handler 120 includes a validation manager 134, which determines whether received data or events are intended for the pipeline circuit 80. The validation manager 134 may make this determination by analyzing the header (or a portion thereof) of the message that contains the data or the event, by analyzing the type of data or event, or the analyzing the instance identification (i.e., the hardwired pipeline 74 for which the data/event is intended) of the data or event. If the input-data handler 120 receives data or an event that is not intended for the pipeline circuit 80, then the validation manager 134 prohibits the input-data handler from loading the received data/even. Where the peer-vector machine 40 includes the router 61 (FIG. 3) such that the pipeline unit 78 should receive only data/events that are intended for the pipeline unit, the validation manager 134 may also cause the input-data handler 120 to send to the host processor 42 (FIG. 3) an exception message that identifies the exception (erroneously received data/event) and the peer that caused the exception.

The output-data handler 126 retrieves processed data from locations of the DPSRAM 102 pointed to by the output-data queue 128, and sends the processed data to one or more peers, such as the host processor 42 (FIG. 3), via the industry-standard bus adapter 118. The output-data handler 126 includes an interface 136, which reads the processed data from the DPSRAM 102 via the port 112. The interface 136 is further discussed below in conjunction with FIG. 10. The output-data handler 126 also retrieves from the output-event queue 130 events generated by the pipelines $74_1$-$74_n$, and sends the retrieved events to one or more peers, such as the host processor 42 (FIG. 6) via the industry-standard bus adapter 118.

Furthermore, the output-data handler 126 includes a subscription manager 138, which includes a list of peers, such as the host processor 42 (FIG. 6), that subscribe to the processed data and to the events; the output-data handler uses this list to send the data/events to the correct peers. If a peer prefers the data/event to be the payload of a message, then the output-data handler 126 retrieves the network or bus-port address of the peer from the subscription manager 138, generates a header that includes the address, and generates the message from the data/event and the header.

Although the technique for storing and retrieving data stored in the DPSRAMS 100 and 102 involves the use of pointers and data identifiers, one may modify the input- and output-data handlers 120 and 126 to implement other data-management techniques. Conventional examples of such data-management techniques include pointers using keys or tokens, input/output control (10C) block, and spooling.

The communication shell 84 includes a physical layer that interfaces the hardwired pipelines $74_1$-$74_n$ to the output-data queue 128, the controller 86, and the DPSRAMs 100, 102, and 104. The shell 84 includes interfaces 140 and 142, and optional interfaces 144 and 146. The interfaces 140 and 146 may be similar to the interface 136; the interface 140 reads input data from the DPSRAM 100 via the port 108, and the interface 146 reads intermediate data from the DPSRAM 104 via the port 116. The interfaces 142 and 144 may be similar to the interface 132; the interface 142 writes processed data to the DPSRAM 102 via the port 110, and the interface 144 writes intermediate data to the DPSRAM 104 via the port 114.

The controller 86 includes a sequence manager 148 and a synchronization interface 150, which receives one or more synchronization signals SYNC. A peer, such as the host processor 42 (FIG. 6), or a device (not shown) external to the peer-vector machine 40 (FIG. 6) may generate the SYNC signal, which triggers the sequence manager 148 to activate the hardwired pipelines $74_1$-$74_n$ as discussed below and in previously cited U.S. patent application Ser. No. 10/683,932 entitled PIPELINE ACCELERATOR HAVING MULTIPLE PIPELINE UNITS AND RELATED COMPUTING MACHINE AND METHOD. The synchronization interface 150 may also generate a SYNC signal to trigger the pipeline circuit 80 or to trigger another peer. In addition, the events from the input-event queue 124 also trigger the sequence manager 148 to activate the hardwired pipelines $74_1$-$74_n$ as discussed below.

The sequence manager 148 sequences the hardwired pipelines $74_1$-$74_n$ through their respective operations via the communication shell 84. Typically, each pipeline 74 has at least three operating states: preprocessing, processing, and post processing. During preprocessing, the pipeline 74, e.g., initializes its registers and retrieves input data from the DPSRAM 100. During processing, the pipeline 74, e.g., operates on the retrieved data, temporarily stores intermediate data in the DPSRAM 104, retrieves the intermediate data from the DPSRAM 104, and operates on the intermediate data to generate result data. During post processing, the pipeline 74, e.g., loads the result data into the DPSRAM 102. Therefore, the sequence manager 148 monitors the operation of the pipelines $74_1$-$74_n$ and instructs each pipeline when to begin each of its operating states. And one may distribute the pipeline tasks among the operating states differently than described above. For example, the pipeline 74 may retrieve input data from the DPSRAM 100 during the processing state instead of during the preprocessing state.

Furthermore, the sequence manager 148 maintains a predetermined internal operating synchronization among the hardwired pipelines $74_1$-$74_n$. For example, to avoid all of the pipelines $74_1$-$74_n$ simultaneously retrieving data from the DPSRAM 100, it may be desired to synchronize the pipelines such that while the first pipeline $74_1$ is in a preprocessing state, the second pipeline $74_2$ is in a processing state and the third pipeline $74_3$ is in a post-processing state. Because a state of one pipeline 74 may require a different number of clock cycles than a concurrently performed state of another pipeline, the pipelines $74_1$-$74_n$ may lose synchronization if allowed to run freely. Consequently, at certain times there may be a "bottle neck," as, for example, multiple pipelines 74 simultaneously attempt to retrieve data from the DPSRAM 100. To prevent the loss of synchronization and its undesirable consequences, the sequence manager 148 allows all of the pipelines 74 to complete a current operating state before allowing any of the pipelines to proceed to a next operating state. Therefore, the time that the sequence manager 148 allots for a current operating state is long enough to allow the slowest pipeline 74 to complete that state. Alternatively, circuitry (not shown) for maintaining a predetermined operating synchronization among the hardwired pipelines $74_1$-$74_n$ may be included within the pipelines themselves.

In addition to sequencing and internally synchronizing the hardwired pipelines $74_1$-$74_n$, the sequence manager 148 synchronizes the operation of the pipelines to the operation of other peers, such as the host processor 42 (FIG. 6), and to the operation of other external devices in response to one or more SYNC signals or to an event in the input-events queue 124.

Typically, a SYNC signal triggers a time-critical function but requires significant hardware resources; comparatively, an event typically triggers a non-time-critical function but requires significantly fewer hardware resources. As discussed in previously cited U.S. patent application Ser. No. 10/683, 932 entitled PIPELINE ACCELERATOR HAVING MULTIPLE PIPELINE UNITS AND RELATED COMPUTING MACHINE AND METHOD, because a SYNC signal is routed directly from peer to peer, it can trigger a function more quickly than an event, which must makes its way through, e.g., the pipeline bus 50 (FIG. 6), the input-data handler 120, and the input-event queue 124. But because they are separately routed, the SYNC signals require dedicated circuitry, such as routing lines, buffers, and the SYNC interface 150, of the pipeline circuit 80. Conversely, because they use the existing data-transfer infrastructure (e.g. the pipeline bus 50 and the input-data handler 120), the events require only the dedicated input-event queue 124. Consequently, designers tend to use events to trigger all but the most time-critical functions.

For some examples of function triggering and generally a more detailed description of function triggering, see application Ser. No. 10/683,929 entitled PIPELINE ACCELERATOR FOR IMPROVED COMPUTING ARCHITECTURE AND RELATED SYSTEM AND METHOD.

Figure 9:
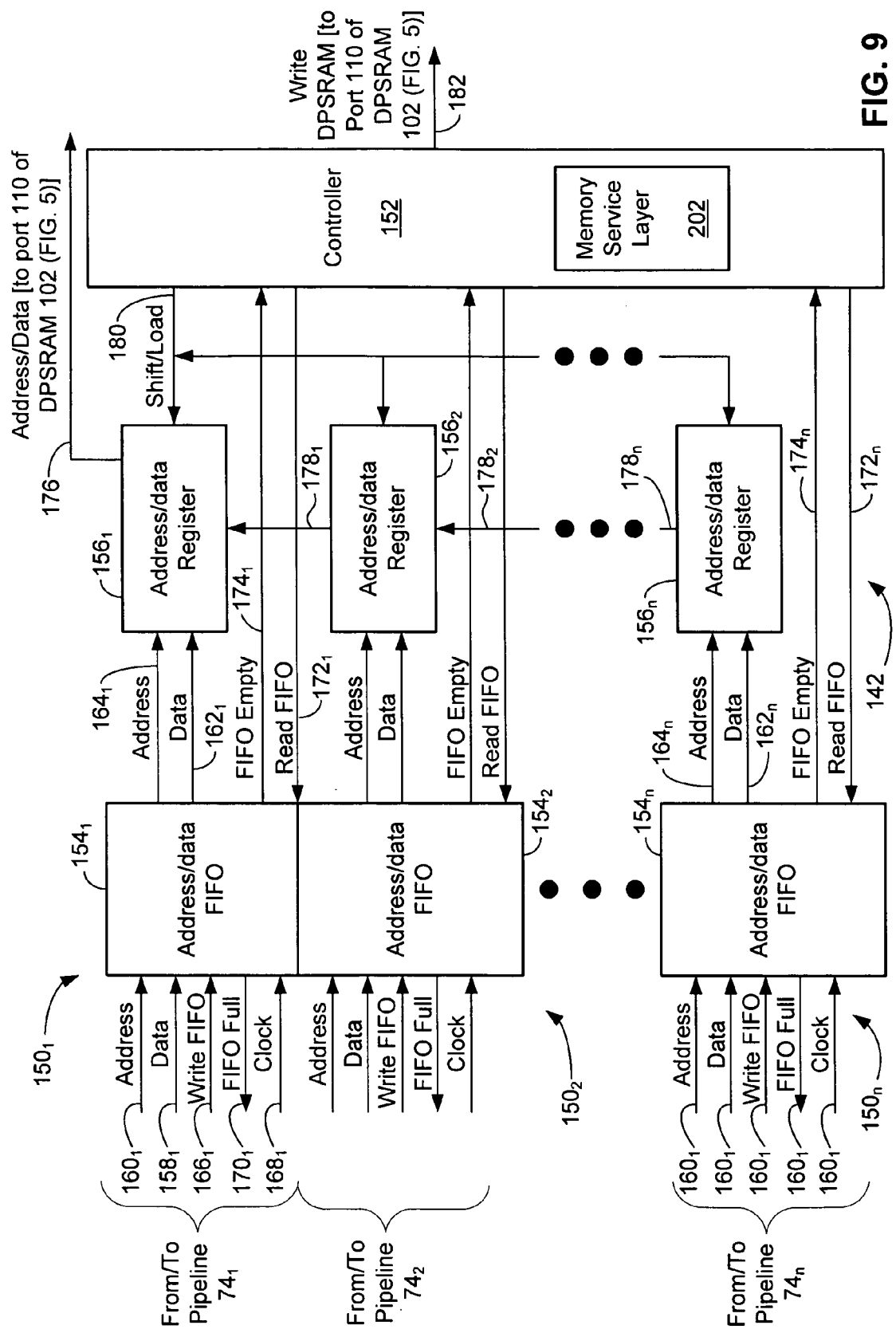
FIG. 9 is a block diagram of the interface 142 of FIG. 8 according to an embodiment of the invention.

FIG. 9 is a block diagram of the interface 142 of FIG. 8 according to an embodiment of the invention. In FIG. 9, a memory controller 152 corresponds to the memory controller 210 of FIG. 2 that is contained within the memory service layer 202 according to embodiments of the present invention. As discussed above in conjunction with FIG. 8, the interface 142 writes processed data from the hardwired pipelines $74_1$-$74_n$ to the DPSRAM 102. As discussed below, the structure of the interface 142 reduces or eliminates data "bottlenecks" and, where the pipeline circuit 80 (FIG. 8) is a PLIC, makes efficient use of the PLIC's local and global routing resources.

The interface 142 includes write channels $150_1$-$150_n$, one channel for each hardwired pipeline $74_1$-$74_n$ (FIG. 5), and includes the controller 152. For purposes of illustration, the channel $150_1$ is discussed below, it being understood that the operation and structure of the other channels $150_2$-$150_n$ are similar unless stated otherwise.

The channel $150_1$ includes a write-address/data FIFO $154_1$ and an address/data register $156_1$.

The FIFO $154_1$ stores the data that the pipeline $74_1$ writes to the DPSRAM 102, and stores the address of the location within the DPSRAM 102 to which the pipeline writes the data, until the controller 152 can actually write the data to the DPSRAM 102 via the register $156_1$. Therefore, the FIFO $154_1$ reduces or eliminates the data bottleneck that may occur if the pipeline $74_1$ had to "wait" to write data to the channel $150_1$ until the controller 152 finished writing previous data.

The FIFO $154_1$ receives the data from the pipeline $74_1$ via a bus $158_1$, receives the address of the location to which the data is to be written via a bus $160_1$, and provides the data and address to the register $156_1$ via busses $162_1$ and $164_1$, respectively. Furthermore, the FIFO $154_1$ receives a WRITE FIFO signal from the pipeline $74_1$ on a line $166_1$, receives a CLOCK signal via a line $168_1$, and provides a FIFO FULL signal to the pipeline $74_1$ on a line $170_1$. In addition, the FIFO $154_1$ receives a READ FIFO signal from the controller 152 via a line $172_1$, and provides a FIFO EMPTY signal to the controller via a line $174_1$. Where the pipeline circuit 80 (FIG. 8) is a PLIC, the busses $158_1$, $160_1$, $162_1$, and $164_1$ and the lines $166_1$, $168_1$, $170_1$, $172_1$, and $174_1$ are preferably formed using local routing resources. Typically, local routing resources are preferred to global routing resources because the signal-path lengths are generally shorter and the routing is easier to implement.

The register $156_1$ receives the data to be written and the address of the write location from the FIFO $154_1$ via the busses $162_1$ and $164_1$, respectively, and provides the data and address to the port 110 of the DPSRAM 102 (FIG. 8) via an address/data bus 176. Furthermore, the register $156_1$ also receives the data and address from the registers $156_2$-$156_n$ via an address/data bus $178_1$ as discussed below. In addition, the register $156_1$ receives a SHIFT/LOAD signal from the controller 152 via a line 180. Where the pipeline circuit 80 (FIG. 8) is a PLIC, the bus 176 is typically formed using global routing resources, and the busses $178_1$-$178_{n-1}$ and the line 180 are preferably formed using local routing resources.

In addition to receiving the FIFO EMPTY signal and generating the READ FIFO and SHIFT/LOAD signals, the controller 152 provides a WRITE DPSRAM signal to the port 110 of the DPSRAM 102 (FIG. 8) via a line 182.

Still referring to FIG. 9, the operation of the interface 142 is discussed.

First, the FIFO $154_1$ drives the FIFO FULL signal to the logic level corresponding to the current state ("full" or "not full") of the FIFO.

Next, if the FIFO $154_1$ is not full and the pipeline $74_1$ has processed data to write, the pipeline drives the data and corresponding address onto the busses $158_1$ and $160_1$, respectively, and asserts the WRITE signal, thus loading the data and address into the FIFO. If the FIFO $154_1$ is full, however, the pipeline $74_1$ waits until the FIFO is not full before loading the data.

Then, the FIFO $154_1$ drives the FIFO EMPTY signal to the logic level corresponding to the current state ("empty" or "not empty") of the FIFO.

Next, if the FIFO $154_1$ is not empty, the controller 152 asserts the READ FIFO signal and drives the SHIFT/LOAD signal to the load logic level, thus loading the first loaded data and address from the FIFO into the register $156_1$. If the FIFO $154_1$ is empty, the controller 152 does not assert READ FIFO, but does drive SHIFT load to the load logic level if any of the other FIFOs $154_2$-$154_n$ are not empty.

The channels $150_2$-$150_n$ operate in a similar manner such that first-loaded data in the FIFOs $154_2$-$154_n$ are respectively loaded into the registers $156_2$-$156_n$.

Then, the controller 152 drives the SHIFT/LOAD signal to the shift logic level and asserts the WRITE DPSRAM signal, thus serially shifting the data and addresses from the registers $156_1$-$156_n$ onto the address/data bus 176 and loading the data into the corresponding locations of the DPSRAM 102. Specifically, during a first shift cycle, the data and address from the register $156_1$ are shifted onto the bus 176 such that the data from the FIFO $154_1$ is loaded into the addressed location of the DPSRAM 102. Also during the first shift cycle, the data and address from the register $156_2$ are shifted into the register $156_1$, the data and address from the register $156_3$ (not shown) are shifted into the register $156_2$, and so on. During a second shift cycle, the data and address from the register $156_1$ are shifted onto the bus 176 such that the data from the FIFO $154_2$ is loaded into the addressed location of the DPSRAM 102. Also during the second shift cycle, the data and address from the register $156_2$ are shifted into the register $156_1$, the data and address from the register $156_3$ (not shown) are shifted into the register $156_2$, and so on. There are n shift cycles, and during the nth shift cycle the data and address from the register $156_n$ (which is the data and address from the FIFO $154_n$) is shifted onto the bus 176. The controller 152 may implement these shift cycles by pulsing the SHIFT/LOAD signal, or by generating a shift clock signal (not shown) that is coupled to the registers $156_1$-$156_n$. Furthermore, if one of the registers $156_1$-$156_n$ is empty during a particular shift operation because its corresponding FIFO $154_1$-$154_n$ was empty when the controller 152 loaded the register, then the controller may bypass the empty register, and thus shorten the shift operation by avoiding shifting null data and a null address onto the bus 176.

Referring to FIGS. 8 and 9, according to an embodiment of the invention, the interface 144 is similar to the interface 142, and the interface 132 is also similar to the interface 142 except that the interface 132 includes only one write channel 150.

Figure 10:
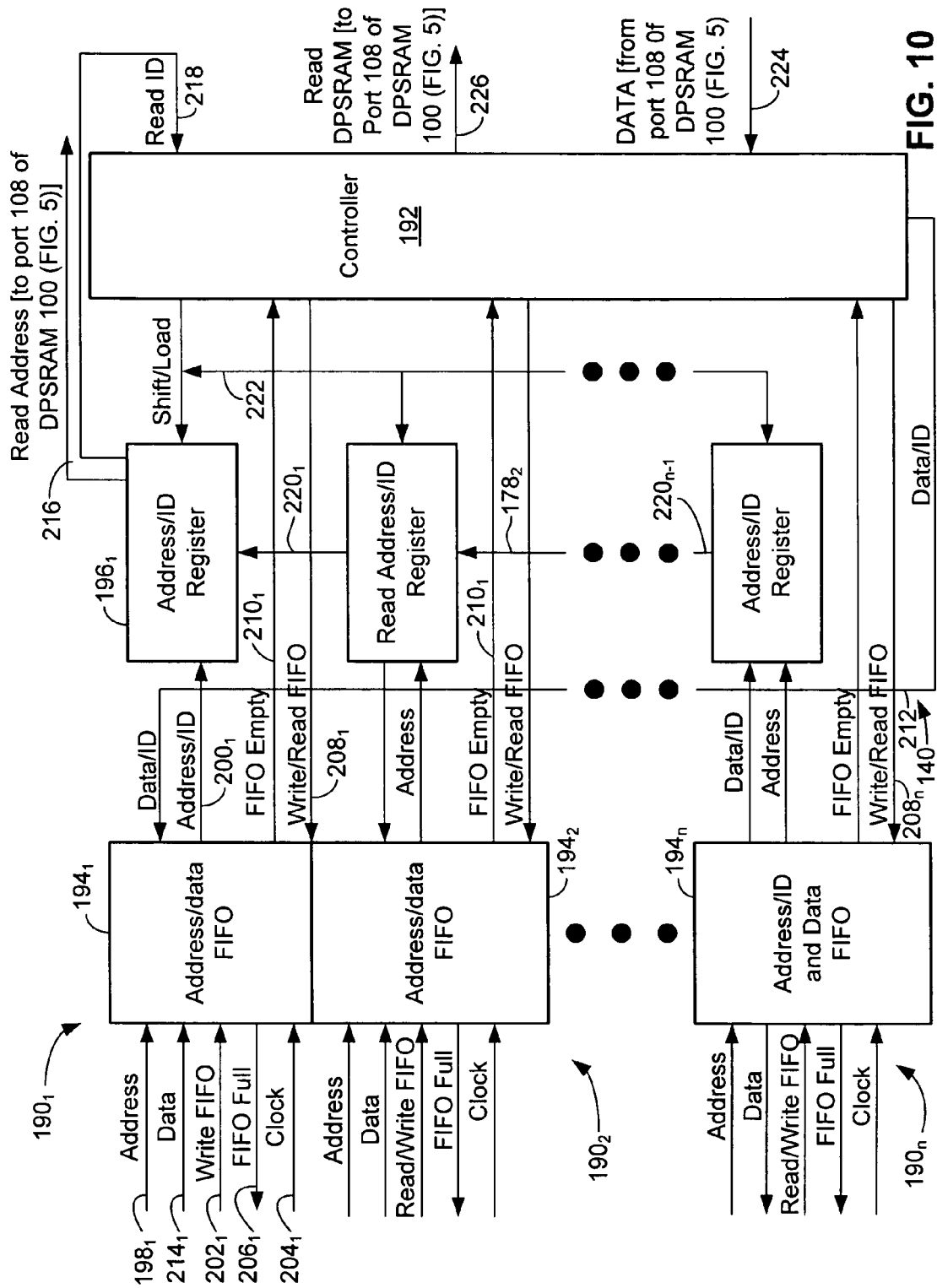
FIG. 10 is a block diagram of the interface 140 of FIG. 8 according to an embodiment of the invention.

FIG. 10 is a block diagram of the interface 140 of FIG. 8 according to an embodiment of the invention. In FIG. 10, a memory controller 192 corresponds to the memory controller 210 of FIG. 2 that is contained in the memory service layer 202 according to embodiments of the present invention. As discussed above in conjunction with FIG. 8, the interface 140 reads input data from the DPSRAM 100 and transfers this data to the hardwired $74_1$-$74_n$. As discussed below, the structure of the interface 140 reduces or eliminates data "bottlenecks" and, where the pipeline circuit 80 (FIG. 8) is a PLIC, makes efficient use of the PLIC's local and global routing resources.

The interface 140 includes read channels $190_1$-$190_n$, one channel for each hardwired pipeline $74_1$-$74_n$ (FIG. 8), and the controller 192. For purposes of illustration, the read channel $190_1$, is discussed below, it being understood that the operation and structure of the other read channels $190_2$-$190_n$ are similar unless stated otherwise.

The channel $190_1$ includes a FIFO $194_1$ and an address/identifier (ID) register $196_1$. As discussed below, the identifier identifies the pipeline $74_1$-$74_n$ that makes the request to read data from a particular location of the DPSRAM 100 to receive the data.

The FIFO $194_1$ includes two sub-FIFOs (not shown), one for storing the address of the location within the DPSRAM 100 from which the pipeline $74_1$ wishes to read the input data, and the other for storing the data read from the DPSRAM 100. Therefore, the FIFO $194_1$ reduces or eliminates the bottleneck that may occur if the pipeline $74_1$ had to "wait" to provide the read address to the channel $190_1$ until the controller 192 finished reading previous data, or if the controller had to wait until the pipeline $74_1$ retrieved the read data before the controller could read subsequent data.

The FIFO $194_1$ receives the read address from the pipeline $74_1$ via a bus $198_1$ and provides the address and ID to the register $196_1$ via a bus $200_1$. Since the ID corresponds to the pipeline $74_1$ and typically does not change, the FIFO $194_1$ may store the ID and concatenate the ID with the address. Alternatively, the pipeline $74_1$ may provide the ID to the FIFO $194_1$ via the bus $198_1$. Furthermore, the FIFO $194_1$ receives a READY WRITE FIFO signal from the pipeline $74_1$ via a line $202_1$, receives a CLOCK signal via a line $204_1$, and provides a FIFO FULL (of read addresses) signal to the pipeline via a line $206_1$. In addition, the FIFO $194_1$ receives a WRITE/READ FIFO signal from the controller 192 via a line $208_1$, and provides a FIFO EMPTY signal to the controller via a line $210_1$. Moreover, the FIFO $194_1$ receives the read data and the corresponding ID from the controller 192 via a bus 212, and provides this data to the pipeline $74_1$ via a bus $214_1$. Where the pipeline circuit 80 (FIG. 8) is a PLIC, the busses $198_1$, $200_1$, and $214_1$ and the lines $202_1$, $204_1$, $206_1$, $208_1$, and $210_1$ are preferably formed using local routing resources, and the bus 212 is typically formed using global routing resources.

The register $196_1$ receives the address of the location to be read and the corresponding ID from the FIFO $194_1$ via the bus $206_1$, provides the address to the port 108 of the DPSRAM 100 (FIG. 8) via an address bus 216, and provides the ID to the controller 192 via a bus 218. Furthermore, the register $196_1$ also receives the addresses and IDs from the registers $196_2$-$196_n$ via an address/ID bus $220_1$ as discussed below. In addition, the register $196_1$ receives a SHIFT/LOAD signal from the controller 192 via a line 222. Where the pipeline circuit 80 (FIG. 8) is a PLIC, the bus 216 is typically formed using global routing resources, and the busses $220_1$-$220_{n-1}$ and the line 222 are preferably formed using local routing resources.

In addition to receiving the FIFO EMPTY signal, generating the WRITE/READ FIFO and SHIFT/LOAD signals, and providing the read data and corresponding ID, the controller 192 receives the data read from the port 108 of the DPSRAM 100 (FIG. 8) via a bus 224 and generates a READ DPSRAM signal on a line 226, which couples this signal to the port 108. Where the pipeline circuit 80 (FIG. 8) is a PLIC, the bus 224 and the line 226 are typically formed using global routing resources.

Still referring to FIG. 10, the operation of the interface 140 is discussed.

First, the FIFO $194_1$ drives the FIFO FULL signal to the logic level corresponding to the current state ("full" or "not full") of the FIFO relative to the read addresses. That is, if the FIFO $194_1$ is full of addresses to be read, then it drives the logic level of FIFO FULL to one level, and if the FIFO is not full of read addresses, it drives the logic level of FIFO FULL to another level.

Next, if the FIFO $194_1$ is not full of read addresses and the pipeline $74_1$ is ready for more input data to process, the pipeline drives the address of the data to be read onto the bus $198_1$, and asserts the READ/WRITE FIFO signal to a write level, thus loading the address into the FIFO. As discussed above in conjunction with FIG. 8, the pipeline $74_1$ gets the address from the input-data queue 122 via the sequence manager 148. If, however, the FIFO $194_1$ is full of read addresses, the pipeline $74_1$ waits until the FIFO is not full before loading the read address.

Then, the FIFO $194_1$ drives the FIFO EMPTY signal to the logic level corresponding to the current state ("empty" or "not empty") of the FIFO relative to the read addresses. That is, if the FIFO $194_1$ is loaded with at least one read address, it drives the logic level of FIFO EMPTY to one level, and if the FIFO is loaded with no read addresses, it drives the logic level of FIFO EMPTY to another level.

Next, if the FIFO $194_1$ is not empty, the controller 192 asserts the WRITE/READ FIFO signal to the read logic level and drives the SHIFT/LOAD signal to the load logic level, thus loading the first loaded address and the ID from the FIFO into the register $196_1$.

The channels $190_2$-$190_n$ operate in a similar manner such that the controller 192 respectively loads the first-loaded addresses and IDs from the FIFOs $194_2$-$194_n$ into the registers $196_2$-$196_n$. If all of the FIFOs $194_2$-$194_n$ are empty, then the controller 192 waits for at least one of the FIFOs to receive an address before proceeding.

Then, the controller 192 drives the SHIFT/LOAD signal to the shift logic level and asserts the READ DPSRAM signal to serially shift the addresses and IDs from the registers $196_1$-$196_n$ onto the address and ID busses 216 and 218 and to serially read the data from the corresponding locations of the DPSRAM 100 via the bus 224.

Next, the controller 192 drives the received data and corresponding ID—the ID allows each of the FIFOs $194_1$-$194_n$ to determine whether it is an intended recipient of the data—onto the bus 212, and drives the WRITE/READ FIFO signal to a write level, thus serially writing the data to the respective FIFO, $194_1$-$194_n$.

Then, the hardwired pipelines $74_1$-$74_n$ sequentially assert their READ/WRITE FIFO signals to a read level and sequentially read the data via the busses $214_1$-$214_n$.

Still referring to FIG. 10, a more detailed discussion of their data-read operator is presented.

During a first shift cycle, the controller 192 shifts the address and ID from the register $196_1$ onto the busses 216 and 218, respectively, asserts read DPSRAM, and thus reads the data from the corresponding location of the DPSRAM 100 via the bus 224 and reads the ID from the bus 218. Next, the controller 192 drives WRITE/READ FIFO signal on the line $208_1$ to a write level and drives the received data and the ID onto the bus 212. Because the ID is the ID from the FIFO $194_1$, the FIFO $194_1$ recognizes the ID and thus loads the data from the bus 212 in response the write level of the WRITE/READ FIFO signal. The remaining FIFOs $194_2$-$194_n$ do not load the data because the ID on the bus 212 does not correspond to their IDs. Then, the pipeline $74_1$, asserts the READ/WRITE FIFO signal on the line $202_1$ to the read level and retrieves the read data via the bus $214_1$. Also during the first shift cycle, the address and ID from the register $196_2$ are shifted into the register $196_1$, the address and ID from the register $196_3$ (not shown) are shifted into the register $196_2$, and so on. Alternatively, the controller 192 may recognize the ID and drive only the WRITE/READ FIFO signal on the line $208_1$ to the write level. This eliminates the need for the controller 192 to send the ID to the FIFOs $194_1$-$194_n$. In another alternative, the WRITE/READ FIFO signal may be only a read signal, and the FIFO $194_1$ (as well as the other FIFOs $194_2$-$194_n$) may load the data on the bus 212 when the ID on the bus 212 matches the ID of the FIFO $194_1$. This eliminates the need of the controller 192 to generate a write signal.

During a second shift cycle, the address and ID from the register $196_1$ is shifted onto the busses 216 and 218 such that the controller 192 reads data from the location of the DPSRAM 100 specified by the FIFO $194_2$. Next, the controller 192 drives the WRITE/READ FIFO signal to a write level and drives the received data and the ID onto the bus 212. Because the ID is the ID from the FIFO $194_2$, the FIFO $194_2$ recognizes the ID and thus loads the data from the bus 212. The remaining FIFOs $194_1$ and $194_3$-$194_n$ do not load the data because the ID on the bus 212 does not correspond to their IDs. Then, the pipeline $74_2$ asserts its READ/WRITE FIFO signal to the read level and retrieves the read data via the bus $214_2$. Also during the second shift cycle, the address and ID from the register $196_2$ is shifted into the register $196_1$, the address and ID from the register $196_3$ (not shown) is shifted into the register $196_2$, and so on.

This continues for n shift cycles, i.e., until the address and ID from the register $196_n$ (which is the address and ID from the FIFO $194_n$) are respectively shifted onto the bus 216 and 218. The controller 192 may implement these shift cycles by pulsing the SHIFT/LOAD signal, or by generating a shift clock signal (not shown) that is coupled to the registers $196_1$-$196_n$. Furthermore, if one of the registers $196_1$-$196_2$ is empty during a particular shift operation because its corresponding FIFO $194_1$-$194_n$ is empty, then the controller 192 may bypass the empty register, and thus shorten the shift operation by avoiding shifting a null address onto the bus 216.

Referring to FIGS. 8 and 9, according to an embodiment of the invention, the interface 144 is similar to the interface 140, and the interface 136 is also similar to the interface 140 except that the interface 136 includes only one read channel 190, and thus includes no ID circuitry.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A memory system, comprising:
   a memory controller operable to generate first control signals according to a standard interface, the memory controller further including an attachable behaviors circuit adapted to receive configuration data, the configuration data causing the attachable behaviors circuit to implement corresponding memory behaviors, and the attachable behaviors circuit operable in combination with the memory controller to generate memory addresses using the configuration data, the generated memory addresses defining the corresponding memory behaviors;
   a memory interface adapter coupled to the memory controller, the memory interface adapter operable responsive to the generated memory addresses to develop control signals adapted to access corresponding data storage locations; and
   the attachable behaviors circuitry is operable to execute corresponding memory behaviors without executing programming instructions.

2. The memory system of claim 1 further comprising a physical control layer and wherein the control signals from the memory interface adapter are applied through the physical control layer to access desired storage locations in the memory subsystem.

3. The memory system of claim 1 wherein the memory behaviors executed by the attachable behaviors circuitry includes generating memory addresses to stride through a portion of memory.

4. The memory system of claim 1 wherein the memory behaviors circuitry is formed in a field programmable gate array (FPGA).

5. A memory service layer component, comprising:
   a memory controller operable to generate first control signals;
   an attachable behaviors circuit coupled to the memory controller and adapted to receive configuration data to implement corresponding memory behaviors, the attachable behaviors circuit operable in combination with the memory controller to generate memory addresses using the configuration data, the generated memory addresses defining the corresponding memory behaviors and the memory addresses being part of the first control signals generated by the memory controller;
   a memory interface adapter coupled to the memory controller, the memory interface adapter operable responsive to the first control signals to develop second control signals adapted to access corresponding data storage locations; and the attachable behaviors circuitry is operable to execute corresponding memory behaviors without executing programming instructions.

6. The memory service layer component of claim 5 wherein the memory controller and attachable behaviors circuit include the same read and write state machine circuitry.

7. The memory service layer component of claim 5 wherein the memory controller includes a general read and general write state machine circuitry and wherein the attachable behaviors circuit includes separate attachable read and write state machines.

8. The memory service layer component of claim 5 further including a storage memory for storing configuration parameters and a plurality of registers for storing selected ones of the stored configuration parameters, wherein the parameters stored in the registers define a particular memory behavior implemented by the memory service layer.

9. A peer vector machine, comprising:
a host processor; and
a pipeline accelerator coupled to the host processor, the pipeline accelerator including at least one hardwired pipeline units operable to process data without executing programming instructions, and the accelerator further including a memory service layer component including a memory controller and an attachable behaviors circuit, the attachable behaviors circuit adapted to receive configuration data from the hardwired pipeline units, the configuration data causing the attachable behaviors circuit to implement corresponding memory behaviors, and the attachable behaviors circuit operable in combination with the memory controller to generate memory addresses using the configuration data, the generated memory addresses defining the corresponding memory behaviors.

10. The peer vector machine of claim 9 wherein the attachable behaviors circuit includes a stride value register for storing a stride value and circuitry for generating the memory addresses using the stored stride value.

11. The peer vector machine of claim 9 wherein the memory controller includes general read and general write state machine circuitry and wherein the attachable behaviors circuit includes separate attachable read and write state machine circuitry.

12. The peer vector machine of claim 9 wherein memory service layer further comprises a write index register, a write offset register, a read index register, and a read offset register, the first two of these registers storing data the attachable behaviors circuitry utilizes in generating memory addresses during write operations and the last two of these registers storing data the attachable behaviors circuitry utilizes in generating memory addresses during read operations.

13. The peer vector machine of claim 9 wherein the pipeline accelerator further comprises an input FIFO register coupled to the memory controller, the input FIFO register adapted to receive input data to be written into corresponding data storage locations in a memory subsystem.

14. The peer vector machine of claim 9 wherein the pipeline accelerator further comprises an output FIFO register coupled to the memory controller, the output FIFO register adapted to receive data read from corresponding memory locations in a memory subsystem.

15. A peer vector machine, comprising:
a host processor;
a pipeline accelerator coupled to the host processor, the pipeline accelerator including at least one hardwired pipeline units operable to process data without executing programming instructions, and the accelerator further including a memory service layer component including a memory controller and an attachable behaviors circuit, the attachable behaviors circuit adapted to receive configuration data from the hardwired pipeline units, the configuration data causing the attachable behaviors circuit to implement corresponding memory behaviors, and the attachable behaviors circuit operable in combination with the memory controller to generate memory addresses using the configuration data, the generated memory addresses defining the corresponding memory behaviors;
a memory interface adapter coupled to the memory controller and operable to generate control signals responsive to the generated memory addresses; and
a memory subsystem coupled to the memory interface adapter and operable to access data locations in the memory subsystem responsive to the control signals from the memory interface adapter.

16. The peer vector machine of claim 15 wherein the memory subsystem comprises SRAM.

17. The peer vector machine of claim 15 wherein the memory subsystem comprises DRAM.

18. The peer vector machine of claim 15 wherein the attachable behaviors circuit includes a stride value register for storing a stride value and circuitry for generating the memory addresses using the stored stride value.

19. The peer vector machine of claim 15 wherein the memory interface adapter is configurable to interface the memory controller to different memory subsystems.

* * * * *